(12) United States Patent
Zorian

(10) Patent No.: US 7,237,154 B1
(45) Date of Patent: Jun. 26, 2007

(54) APPARATUS AND METHOD TO GENERATE A REPAIR SIGNATURE

(75) Inventor: Yervant Zorian, Santa Clara, CA (US)

(73) Assignee: Virage Logic Corporation, Fremont, CA (US)

( * ) Notice: Subject to any disclaimer, the term of this patent is extended or adjusted under 35 U.S.C. 154(b) by 989 days.

(21) Appl. No.: 10/083,241

(22) Filed: Feb. 25, 2002

Related U.S. Application Data

(60) Provisional application No. 60/301,901, filed on Jun. 29, 2001.

(51) Int. Cl.
*G11C 29/00* (2006.01)

(52) U.S. Cl. .................. 714/711; 714/721; 714/723

(58) Field of Classification Search ............... 324/763; 714/25, 733, 7, 711, 721, 723; 702/117
See application file for complete search history.

(56) References Cited

U.S. PATENT DOCUMENTS

| | | | |
|---|---|---|---|
| 5,513,318 A | 4/1996 | van de Goor et al. | |
| 5,570,374 A | 10/1996 | Yau et al. | |
| 5,583,463 A | 12/1996 | Merritt | |
| 5,608,678 A | 3/1997 | Lysinger | |
| 5,960,009 A | 9/1999 | Gizopoulos et al. | |
| 5,978,935 A | 11/1999 | Kim et al. | |
| 5,978,947 A | 11/1999 | Kim et al. | |
| 6,067,262 A | 5/2000 | Irrinki et al. | |
| 6,085,334 A | 7/2000 | Giles et al. | |
| 6,181,614 B1 | 1/2001 | Aipperspach et al. | |
| 6,205,564 B1 | 3/2001 | Kim et al. | |
| 6,237,123 B1 | 5/2001 | Kim et al. | |
| 6,255,836 B1 * | 7/2001 | Schwarz et al. | 324/763 |
| 6,304,989 B1 | 10/2001 | Kraus et al. | |
| 6,317,846 B1 | 11/2001 | Higgins et al. | |
| 6,330,696 B1 | 12/2001 | Zorian et al. | |
| 6,396,760 B1 | 5/2002 | Behera et al. | |
| 6,397,349 B2 | 5/2002 | Higgins et al. | |
| 6,408,401 B1 | 6/2002 | Bhavsar et al. | |
| 6,496,946 B2 * | 12/2002 | Bannatyne et al. | 714/25 |
| 6,510,398 B1 * | 1/2003 | Kundu et al. | 702/117 |
| 6,519,202 B1 | 2/2003 | Shubat et al. | |
| 6,574,757 B1 | 6/2003 | Park et al. | |
| 6,651,202 B1 * | 11/2003 | Phan | 714/733 |
| 6,691,252 B2 | 2/2004 | Hughes et al. | |
| 6,766,468 B2 * | 7/2004 | Barth et al. | 714/7 |
| 6,795,942 B1 | 9/2004 | Schwarz | |

OTHER PUBLICATIONS

TechWeb definition, Author Unknown, scan technology, copyright 1991 2001, 1 page.

S. Shoukourian, V. Vardanian, Y. Zorian, "An Approach for Evaluation of Redundancy Analysis Algorithms". The Proceedings of IEEE Int. Workshop on Memory Technology, Design and Testing, 2001.

(Continued)

*Primary Examiner*—David Ton
(74) *Attorney, Agent, or Firm*—Blakely, Sokoloff, Taylor & Zafman LLP

(57) ABSTRACT

In general, various methods, apparatuses, and systems that generate an augmented repair signature to repair all of the defects detected in a first test of a memory as well as in a second test of the memory.

24 Claims, 19 Drawing Sheets

OTHER PUBLICATIONS

D. K. Bhavsar, "An Algorithm for Row-Column Self-Repair of RAMs and its Implementation in the Alpha 21264", Proc. ITC'1999, pp. 311-318.

T. Kawagoe, J. Ohtani, M. Niiro et al. "A Built-In Self-Repair Analyzer (CRESTA) for embedded DRAMS", Proc. ITC'2000, pp. 567-574.

Yervant Zorian: "System-Chip Test Strategies" (Tutorial): DAC 1998: 752-757.

Iiyoung Kim, Yervant Zorian, Goh Komoriya, Hai Pham, Frank P. Higgins, Jim L. Lewandowski: "Built-in Self-Repair for Embedded High Density SRAM." ITC 1998: 1112-1119.

Yervant Zorian, Erik Jan Marinissen, Sujit Dey: "Testing Embedded-Core Based System Chips." ITC 1998: pp. 1-14.

Yervant Zorian, Erik Jan Marinissen, "System Chip Test: How Will It Impact Your Design?" pp. 1-6, DAC, 2000.

Monica Lobetti Bodoni, Alfredo Benso, Silvia Chiusano, Stefano DiCarlo, Giorgio DiNatale, Paolo Prinetto, "An Effective Distributed BIST Architecture for RAMs," pp. 1-6, IEEE European Test Workshop, 2000.

Chauchin Su, Shih-Ching Hsiao, Hau-Zen Zhau, Chung-Len Lee, "A Computer Aided Engineering System for Memory BIST," pp. 1-4, DAC, 2001.

Tsin-Yuanchang et al., "Tutorial 2: SoC Testing and P1500 Standard", Asian Test Symposium 2000: 492.

Erik Jan Marinissen et al., "Wrapper Design for Embedded Core Test", ITC 2000: 911-920.

Alfredo Benso et al., "HD-BIST: A Hierarchical Framework for BIST Scheduling and Diagnosis in SOCS", ITC 1999: 1038-1044.

D. Gizopoulos et al, "Low Power/Energy BIST Scheme for Datapaths", VTS 2000: pp. 6 total.

V.A. Vardanian et al., "A March-based Fault Location Algorithm for Static Random Access Memories", MDTD 2002: 256-261 Jul. 10-12, 2002.

Alfredo Benso et al., "HD2BIST: a Hierarchical Framework for BIST Scheduling, Data patterns delivering and diagnosis in SoCs", ITC 2000: PP. 10 total.

Yervant Zorian et al., "Embedded-Memory Test and Repair: Infrastructure IP for SoC Yield", IEEE CS and IEEE CASS May-Jun. 2003: 58-66.

Yervant Zorian et al., "Embedding Infrastructure IP for SoC Yield Improvement", Jun. 2002, pp. 709-712.

Praveen Parvathala et al., "FRITS-A Microprocessor Functional BIST Method", Mar. 2002, pp. 590-598.

* cited by examiner

Start condition for BIRA registers

Multiple errors in Row fix with Row1

Cover single error with column, register connectivity Row_H

Multiple errors in Row fix with Row2

US 7,237,154 B1

APPARATUS AND METHOD TO GENERATE A REPAIR SIGNATURE

RELATED APPLICATIONS

This application is a continuation of provisional U.S. patent application Ser. No. 60/301,901, filed on Jun. 29, 2001.

FIELD OF THE INVENTION

The present invention relates generally to generation of a repair signature to repair one or more memories containing defective components, and more specifically an aspect of the invention relates to augmenting an existing repair signature.

BACKGROUND OF THE INVENTION

Random defects occurring during the manufacturing of an integrated circuit with embedded memory blocks that can render certain non-redundant elements of an integrated circuit memory device, such as a memory column, defective. For example, particle contamination during the manufacturing process may cause broken or shorted out columns and bit defects.

Redundant elements in an integrated circuit memory device, such as redundant columns, are used to compensate for these random defects. Initial testing of an integrated circuit memory occurs after the manufacturing process. During the initial manufacturing testing of an integrated circuit memory device, defective elements are replaced by non-defective elements referred to as redundant elements. Thus, redundant components, such as redundant columns and redundant rows, may be used in a scheme to replace defective non-redundant components, discovered during initial testing of the integrated circuit memory device. Typically, once a test of a memory occurs a repair signature is generated. A repair signature is typically a binary coded sequence that identifies the defective components detected and the redundant components allocated to replace those components. The use of redundant elements and a repair signature is important in increasing the overall yield of manufacturing integrated circuits with memory devices in a single chip.

FIG. 1 illustrates a block diagram of a previous technology to generate a repair signature for an embedded memory possessing a redundancy structure used in a system on a chip (SoC). SoC 102 integrates on-chip memory 104 with processors and other similar components, all on the same chip, to decrease cost and increase performance. Redundancy techniques include adding extra memory rows and memory columns that can be substituted for defective components within the memory. The prior external test solution creates a hard repair signature under one set of conditions. The single set of conditions is typically standard operating temperature and voltage.

Four equipment insertions may be required when testing SoC memory 104. First, the external memory tester 108 tests the memory to find defective components on the SoC 102 die. The external memory tester 108 imports the failure results in order to perform redundancy analysis and allocation. The external memory tester 108 sends the repair signature, or in other words the information on how to allocate the repair elements for any defects, to the laser repair equipment 110. Second, the laser repair equipment 110 blows the fuses on the SoC 102 wafer that enable the redundant rows and memory columns to be substituted for the defective memory cells. Third, the memory tester 108 re-tests memory on the SoC 102 to ensure that the repairs were made properly. Last, the logic tester 112 analyzes the remaining non-memory components of the SoC 102.

The typical external test solution limits the detection of defective components to defects occurring during the manufacturing process and at standard environmental conditions and not defects that occur after the SoC is in operation or atypical environmental conditions such as high and low temperatures, high and low levels of operating voltages, high and low frequency conditions, etc. Further, the typical external solution may run a first test algorithm to determine defects in the memory or a second test algorithm to determine the defects in the memory. Test algorithms are typically rated to detect a given percentage of the actual defects that exist in a memory, such as 95% effective or 99% effective. The manufacturer may then choose to apply the results of the first test algorithm or the second test algorithm to repair a memory. However, no way exists to compare the results of the first test algorithm and the second test algorithm to repair all the defects detected by either the first test algorithm and the second test algorithm. Also, memory tester 108 may not be able to test the memories at the speed of the chip. Thus, potential defects that only occur when the memory is operating at speed may not be detected.

SUMMARY OF THE INVENTION

Various methods, apparatuses, and systems that generate an augmented repair signature to repair all of the defects detected in a first test of a memory as well as in a second test of the memory.

BRIEF DESCRIPTION OF THE DRAWINGS

The drawings refer to the invention in which.

Figure 1:
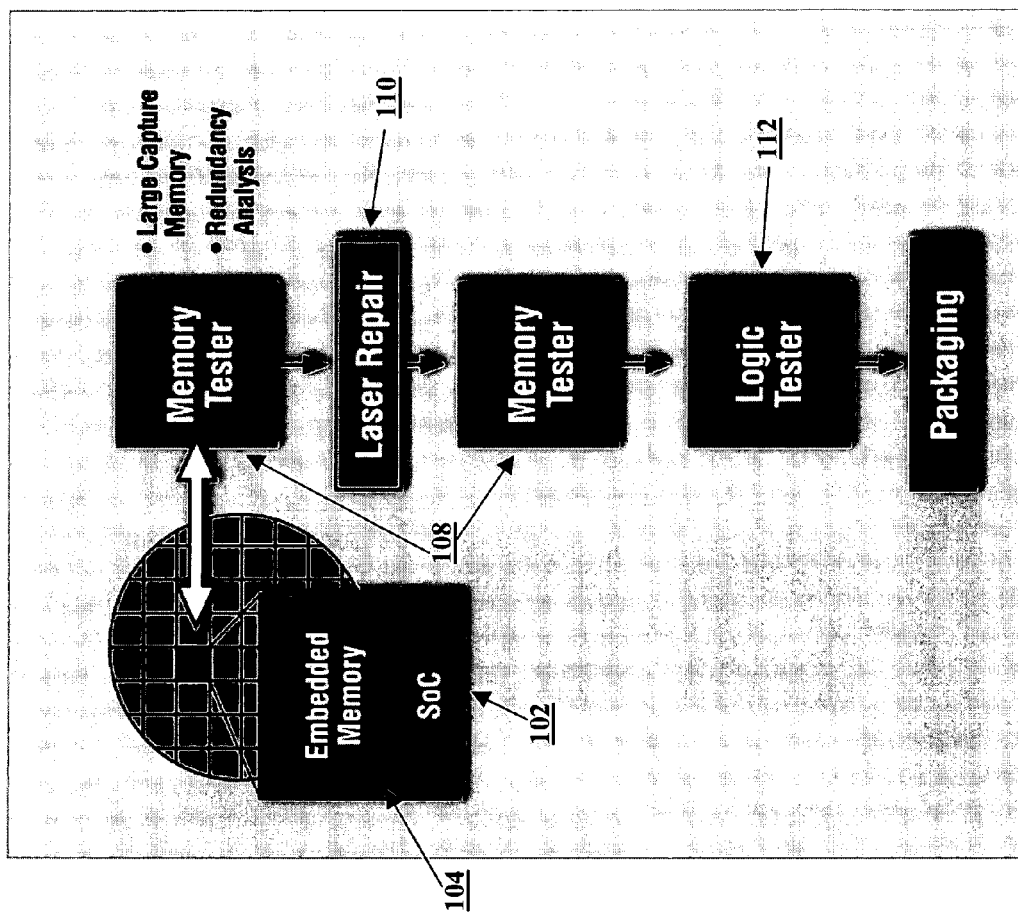
FIG. 1 illustrates a block diagram of a previous technology to generate a repair signature for an embedded memory possessing a redundancy structure used in a system on a chip (SoC)

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, sequence of specific registers changing status, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Thus, the specific details set forth are merely exemplary. The specific details may be varied from and still be contemplated to be within the spirit and scope of the present invention.

In general, various methods, apparatuses, and systems that generate an augmented repair signature to repair all of the defects detected in a first test of a memory as well as in a second test of the memory.

Figure 2A:
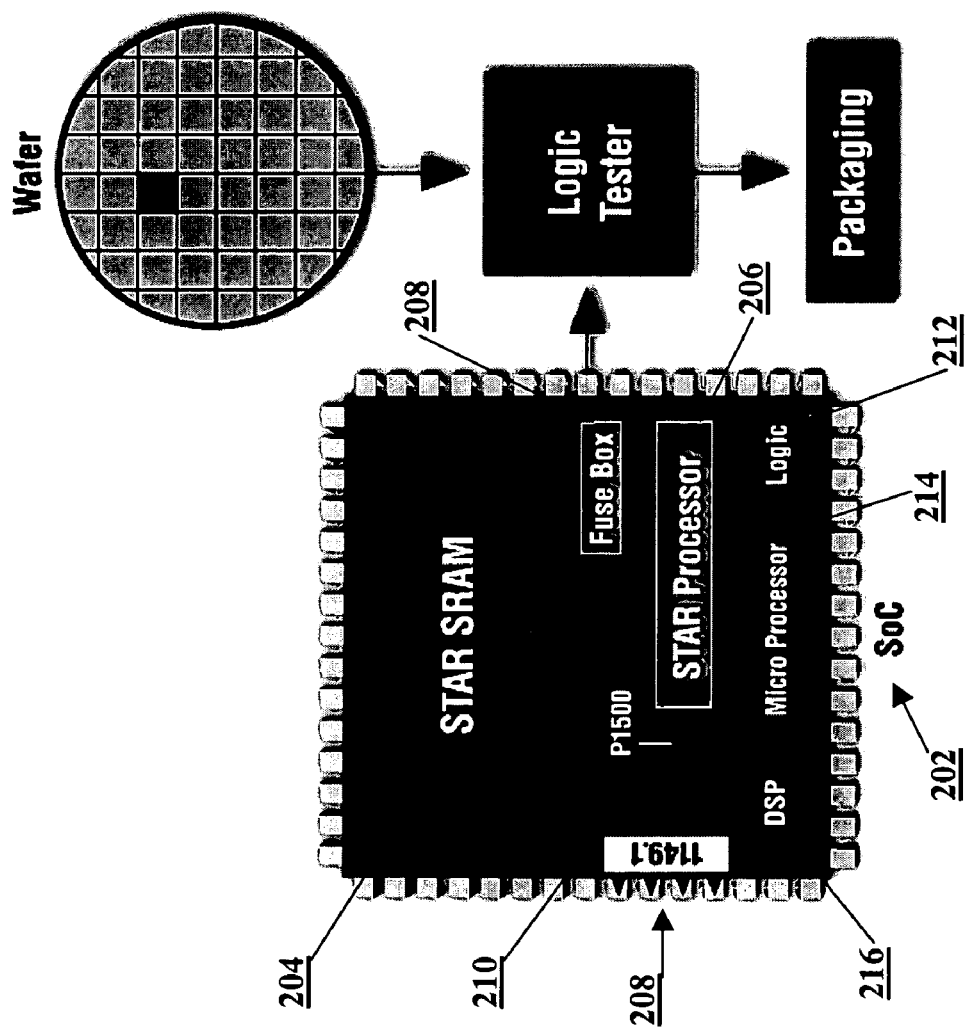
FIG. 2a illustrates an embodiment of a block diagram of one or more memories with each memory having one or more redundant components associated with that memory and a processor containing reconfiguration logic to generate an augmented repair signature.

FIG. 2a illustrates an embodiment of a block diagram of one or more memories with each memory having one or more redundant components associated with that memory and a processor that contains reconfiguration logic to generate an augmented repair signature. In an embodiment, the chip 202 may contain components such as one or more memories 204, one or more processors 206, one or more external interface 208, one or more internal interfaces 210, one or more logic sections 212, one or more microprocessors 214, one or more digital signal processors 216, and one or more fuse boxes 218. In an embodiment, the one or more memories 204 may be a volatile memory such as, static random access memory (SRAM). In an embodiment, the processor 206 may be an application specific processor, such as a self-test and repair processor (STAR). In an embodiment, redundancy allocation logic contained within the processor 206 or in the logic 216 may have one or more algorithms to allocate the one or more redundant components (not shown), such as redundant columns and redundant rows. Built in self-test logic may contain one or more algorithms to detect defective components in the one or more memories 204. Reconfiguration logic continued within the processor 206 or in the logic 216 may have one or more algorithms to augment an existing repair signature. In an embodiment, the one or more external interfaces 208 may be an IEEE 1149.1 interface. In an embodiment, the one or more internal interfaces 210 may be an IEEE P1500 interface.

In an embodiment, the reconfiguration logic may be configured to receive an existing repair signature and decode the existing repair signature. The reconfiguration logic may insert the contents of the existing repair signature into registers associated with the redundancy allocation logic. The reconfiguration logic may initiate another built in self-test of the one or more memories 204 and another redundancy allocation algorithm of the one or more memories 204. The new redundancy allocation algorithm, the new test algorithm, and/or the new environmental conditions at the time of the new test and redundancy algorithms may be completely different algorithms and conditions than when the first test and repair were used to generate the existing repair signature. The new test and repair data simply augment the contents of the existing repair signature in the registers associated with the redundancy allocation logic. Thus, the cumulative defect information from multiple tests of the memory may be used to generate the new repair signature.

In an embodiment, the processor 206 contains multiple engines to determine how much redundancy is needed and how to partition the redundant components throughout each unique memory array. The processor 206 understands the redundancy scheme, the failure history of the process being used, and how the unit has failed.

The processor 206 increases the yield of useable memories 204 by repairing defective memory components at a very high rate of repair during manufacturing of the chip and after the chip is placed in operation. Upon powering up, the processor contains logic 206 on the chip 202 that automatically tests the memory 204, allocates redundancy resources, and coordinates or performs any necessary repairs. The processor 206 initiates and operates the test program, determines defective memory locations (if any), allocates redundancy resources, and produces a repair signature that resides in a location on the memory 204. In an embodiment, the volatile repair signature is applied to the redundancy control logic and remains there as long as power is applied.

In an embodiment, the processor 206 tests the memory instances 204 at speed; that is, at the speed they will run in the application. After testing and repair of the memory instances 204, the processor 206 turns the memory operation over to the normal address, data and control busses on the SoC. Thus, defects that occur after the processor 206 is placed in operation may be detected and repaired.

As noted, the processor 206 on the chip 202 may augment an existing repair signature by decoding the existing repair signature, performing another test of the memory, making a determination on the allocation of the redundant component associated with the memory, and then generating the new repair signature. The processor 206 generates an augmented repair signature vice generating a new repair signature from a reset state. The processor 206 may receive the existing repair signature from either a source internal or external to the chip.

The repair signature created by the processor 206 may sent to an external tester (not shown) via the one or more external interfaces 208 and/or to the fuse box. In an embodiment, the processor 206 communicates the repair signature during wafer probe. In an embodiment, the laser repair equipment (not shown) programs the fuse box 218 with the necessary repair information.

The fuse box 218 retains the permanent repair signature unique to that individual SoC 202. In an embodiment, the fuse box 218 consists of non-volatile memory such as an EPROM or Flash memory. The repair signature generation can be executed either at wafer sort or at system power-on. In an embodiment, the processor 206 determines and stores the repair data signature in order to eliminate the need for a fuse box 218. In an embodiment, the processor 206 after system power-on transfers the corresponding repair data signature directly into scan flip-flops contained within each unique memory instance 204 in the SoC 202.

The field repair feature allows a new test every time the processor 206 is powered up or reset under control of the application's software but it is performed at ambient environmental conditions.

The SoC 202 supports both repair functions: factory repair for manufacturing defects, and field repair for any subsequent problems that may materialize over the life of the end product.

Figure 2B:
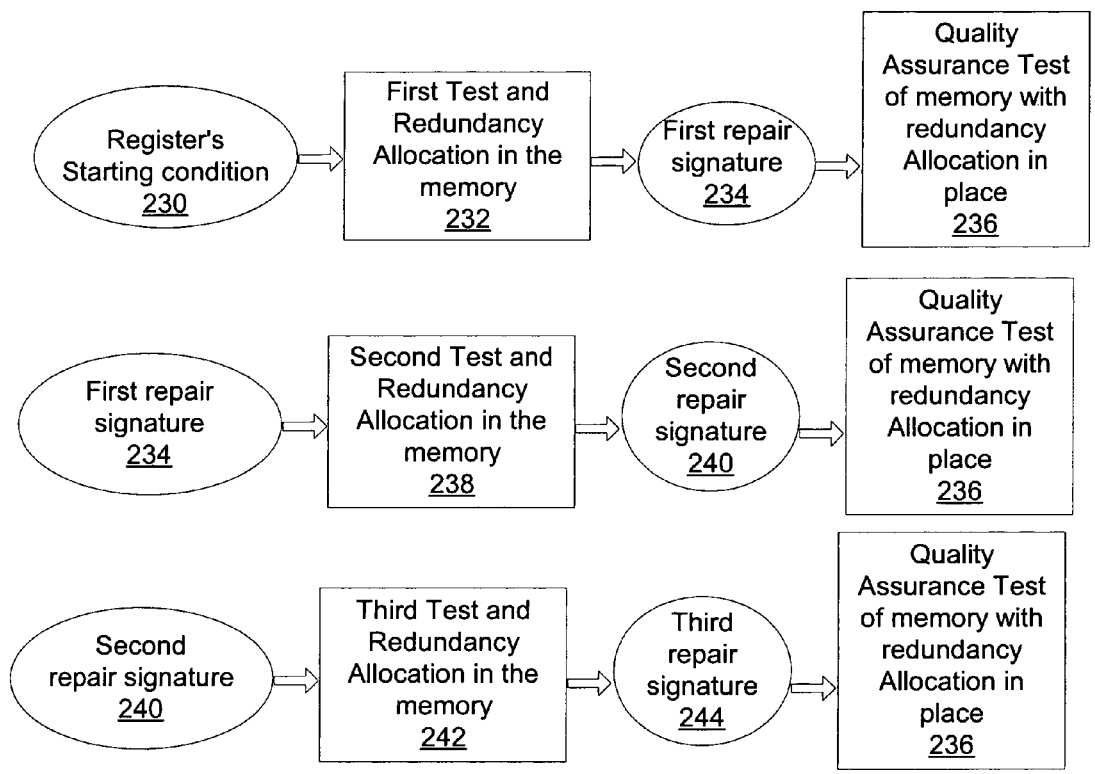
FIG. 2b illustrates a flow diagram of generating multiple exemplary augmented repair signatures.

FIG. 2b illustrates a flow diagram of generating multiple exemplary augmented repair signatures. The exemplary augmented third repair signature 244 cumulatively generates from a first test and redundancy allocation of the memory 232 during the manufacturing process, a second test and redundancy allocation of the memory 238 during the manufacturing process, and a third test and redundancy allocation of the memory 242 in the field after the memory has been placed into operation. The augmented second repair signature cumulatively generates from a first test and redundancy allocation of the memory 232 during the manufacturing process, a second test and redundancy allocation of the memory 238 during the manufacturing process.

The registers in the memory start off with a starting condition 230, not a repair signature, where of all the allocation logic is reset to a starting state. A first test of the memory occurs and a first redundancy allocation algorithm 232 is run. The redundancy allocation algorithm identifies defects and then allocates redundant components to replace those identified defects. The reconfiguration logic collects data from the results of the redundancy allocation algorithm to generate a first repair signature 234. The first test and/or the repair algorithms may be performed by logic on the chip or by test equipment external to the chip.

In an embodiment, a repair signature includes a coded sequence to allocate redundant components to substitute for defective components in order to make the memory usable. The coded sequence loads into registers associated with the redundancy allocation logic to replace all of the identified defective components with redundant components. The repair signature can be hard coded when laser fuses in the fuse box are blown or other similar programmable non-volatile memory is electronically written into.

After the redundancy allocation logic assigns the corresponding redundant components to replace identified defective components, then a quality assurance built in self test of the memory 236 runs one more time just to make sure that the redundant components substituted for the defective components, also do not have defects. The quality assurance built in self-test 236 runs to determine that all defects in the memory have been eliminated through the use of redundant components and that the assigned redundant components have no defects. The entire memory is now a fully functional and useable memory. During the manufacturing process, the repair signature of the useable memory may be sent to a storage device external to the chip or hard coded into the fuse box.

The first repair signature 234 may repair all the identified defects in the memory or the first repair signature may not repair all the identified defects. The memory may be tested multiple times to detect additional defects in the memory or to run a second redundancy allocation algorithm to attempt to repair the identified defects unsuccessfully repaired with the first redundancy allocation logic. Different types of redundancy allocation algorithms repair identified defects in a number of different schemes and patterns. Further, different types of test algorithms are able to detect different types of defects. Also, different environmental conditions cause defects to manifest themselves in a memory that would not necessary manifest themselves during nominal environmental conditions. An augmented repair signature may be generated to build on the cumulative results of all of these tests rather than starting off with a reset starting condition each time a new test is performed.

In an embodiment, reconfiguration logic in the processor may receive the existing first repair signature 234 from a storage device external to the chip or from the fuse box. When the reconfiguration logic receives the first repair signature 234, the reconfiguration logic may initiate a second test algorithm and second redundancy allocation algorithm 238 to attempt to repair the memory. However, the reconfiguration logic augments the first repair signature rather than simply replacing the first repair signature 234. The registers in the test logic and redundancy allocation logic, which identify detected defects and optionally the status of the redundant components, do not start off from a reset state. The contents of the first repair signature may be decoded and restored to registers associated with the test logic and redundancy allocation logic.

When a second test is performed under different environmental conditions or with a different type of test algorithm than the first test algorithm, then newly detected defects are identified in addition to the defects already identified by the first repair signature. The test logic provides the results of the second test, thus all known and identified defects, to the redundancy algorithm to repair all of the defects in the memory. Multiple types of redundancy allocation algorithms may be used until one of the redundancy algorithms successfully substitutes redundant components for all of the known and identified defects in the memory. The reconfiguration logic then generates a second repair signature 240.

Again, after the redundancy allocation logic assigns the corresponding redundant components to replace identified defective components, then a quality assurance built in self test of the memory 236 runs one more time just to make sure that the redundant components substituted for the defective components, also do not have defects.

Thus, during the manufacturing process, the memory may undergo multiple tests under multiple different types of test algorithms and under multiple environmental conditions. In an embodiment, the environmental conditions may be operating voltage, operating temperature, operating speed or another similar environmental condition. Further, the environmental conditions may be nominal, higher then nominal, or lower then nominal. The reconfiguration logic encodes all the defects identified during any of these situations into a repair signature, such as the second repair signature 240. Alternatively, each time a test under a different environmental condition or under a different type of test algorithm is run, then the reconfiguration logic generates another repair signature such as a second, third, fourth, or fifth repair signature. The second repair 240 signature may be permanently stored in the fuse box or in volatile memory.

The fully functional and useable memory may be placed into operation. In an embodiment, a third test and redundancy of the memory 242 may occur. A built in self-test algorithm and built in redundancy allocation algorithm may be automated performed each time processor powers up. The contents of the permanent second repair signature 240 load into the registers associated with the test logic and redundancy allocation logic to form beginning state for those registers. The built in self test algorithm and built in redundancy allocation algorithm may be run to identify any new defects that exist in the memory. In an embodiment, use of the memories or aging of the memories may cause additional defects to develop over time. The newly detected defects are identified in addition to the defects already identified by the second repair signature 240. The reconfiguration logic generates a third repair signature 244 to repair all of the known and identified defects. In an embodiment, the third repair signature 244 may be stored in volatile memory and the contents of the volatile memory load into registers actually implementing the redundancy in the memory. In an embodiment, the reconfiguration logic overwrites the second repair signature 240 in the fuse box with the third repair signature 244.

Again, after the redundancy allocation logic assigns the corresponding redundant components to replace identified defective components, then a quality assurance built in self test of the memory 236 runs one more time just to make sure that the redundant components substituted for the defective components, also do not have defects.

Figure 3:
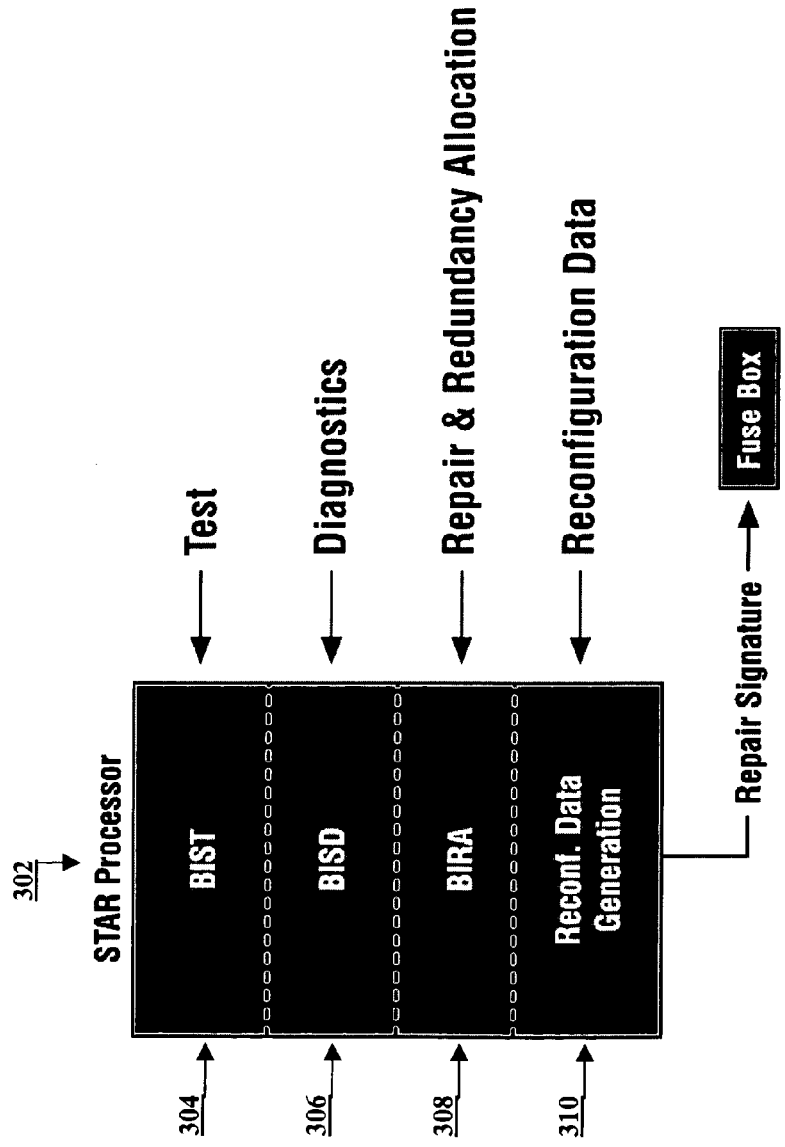
FIG. 3 illustrates an embodiment of a block diagram of a processor containing multiple engines such as a built in self-test engine, a built-in self-diagnosis engine, a built-in redundancy allocation engine, and reconfiguration logic.

FIG. 3 illustrates an embodiment of a block diagram of a processor containing multiple engines such as a built in self-test engine, a built-in self-diagnosis engine, a built-in redundancy allocation engine, and reconfiguration engine. The processor 302 is programmed by a set of instructions, which control logic in the processor such as the engines. The logic elements for each of the engines may be discrete blocks of logic wherein each block of logic performs a specific function, or integrated blocks of logic that perform two or more functions listed below. The BIST engine 304 (Built-in Self-Test) performs tests, e.g. foundry-specific test algorithms, designed to detect defects in the memories. The BISD engine 306 (Built-in Self-Diagnosis) determines the location of the memory defects (if any) and provides error logging and scan-out failure date if required for failure analysis. The BIRA engine 308 (Built-in Redundancy Allocation) identifies and allocates available redundant rows and redundant columns in order to determine the optimum redundancy scheme when a failure occurs. The reconfiguration logic 310 contains logic to receive an existing repair signature, decode the existing repair signature, and generate an augmented repair signature.

Figure 4A:
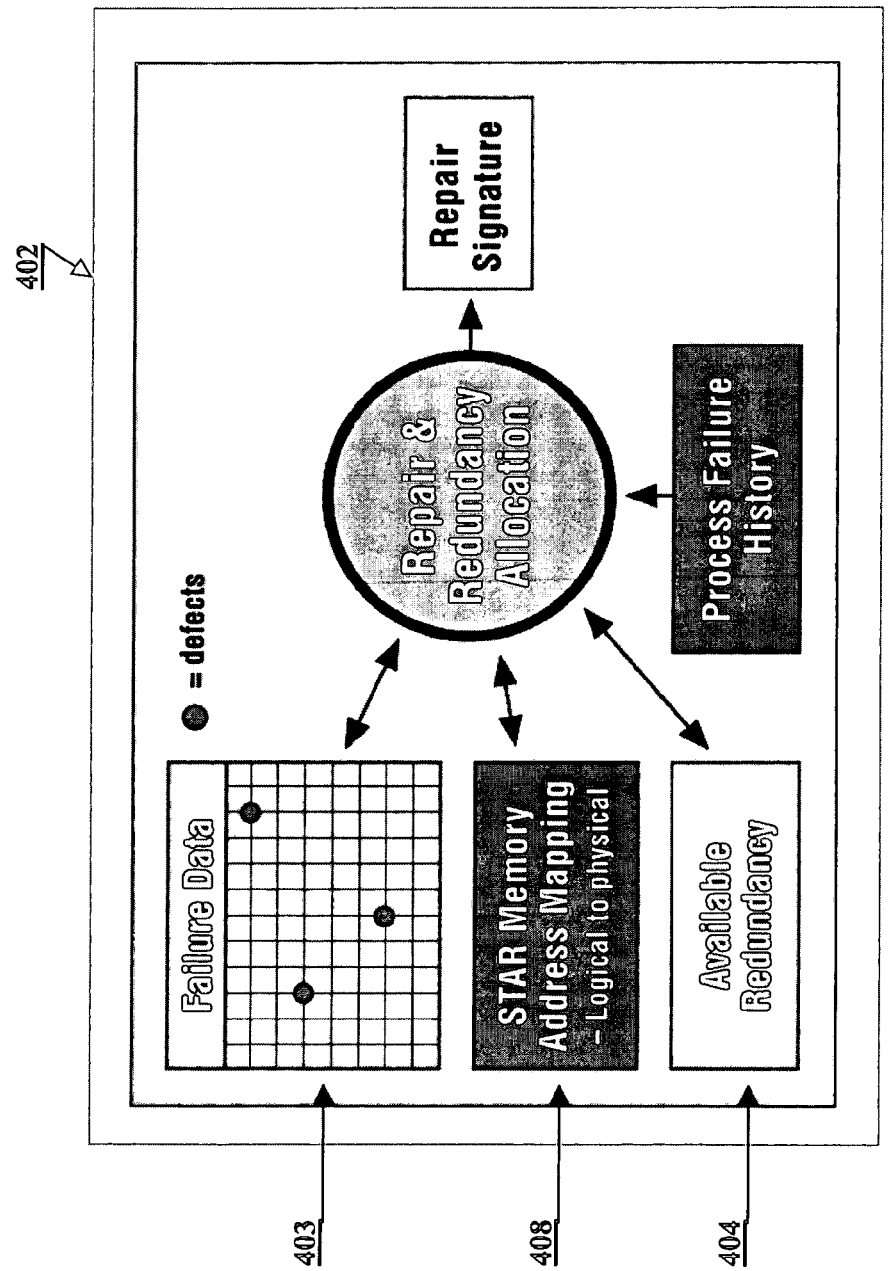
FIG. 4a illustrates an embodiment of a block diagram of the Built-in Redundancy Allocation (BIRA) engine examining information from a database to create a repair signature.

FIG. 4a illustrates an embodiment of a block diagram of the Built-in Redundancy Allocation (BIRA) engine examining information from a database to create a repair signature. The BIRA engine examines information from a database such as process failure history 402, address mapping, available redundancy 404, and the current fault data 403 specific to each unique memory. In an embodiment, the process failure history 402 is fixed information per memory technology consists of failure data from the specific foundry, which assigns higher probability weights to components that typically fail. In an embodiment, the address mapping 408 is fixed information per memory design. In an embodiment, the available redundancy 404, and the current fault data 403 are flexible information per chip.

Referring to FIG. 3, the processor can use the BISD engine 306 to find the defects and the BIRA engine 308 to repair the memory. The BIST engine 304 runs a test program to detect faults in the memory array. The BIRA engine 308 allocates the available redundant components to repair the memory and sends the repair information to the Reconfiguration Data engine 310. The Reconfiguration Data engine 310 translates redundancy allocation into a memory-specific repair signature that can be both sent to the external memory tester to be programmed into a fuse box or sent directly to scan chain registers in the memories themselves.

As noted above, the reconfiguration logic 310 may receive an existing repair signature. The reconfiguration logic may consists of logic to identify defective components in the one or more memories from the first repair signature, logic to initiate the test on the memory to identify defective components, and logic to generate the second repair signature. In an embodiment, the logic consists of electronic circuits that follow the rules of Boolean Logic and software that contain patterns of instructions. The logic can further decode the existing repair signature, insert the contents of the existing repair signature into registers associated with the redundancy allocation logic, initiate another built in self-test of the one or more memories, and initiate another repair algorithm of the one or more memories. The new repair algorithm, new built in self test algorithm, and/or the environmental conditions at the time of the new test and repair may be completely different algorithms and conditions than when the first test and repair were used to generate the existing repair signature. The new test and repair data simply augment the contents of the existing repair signature in the registers associated with the redundancy allocation logic 308.

Figure 4B:
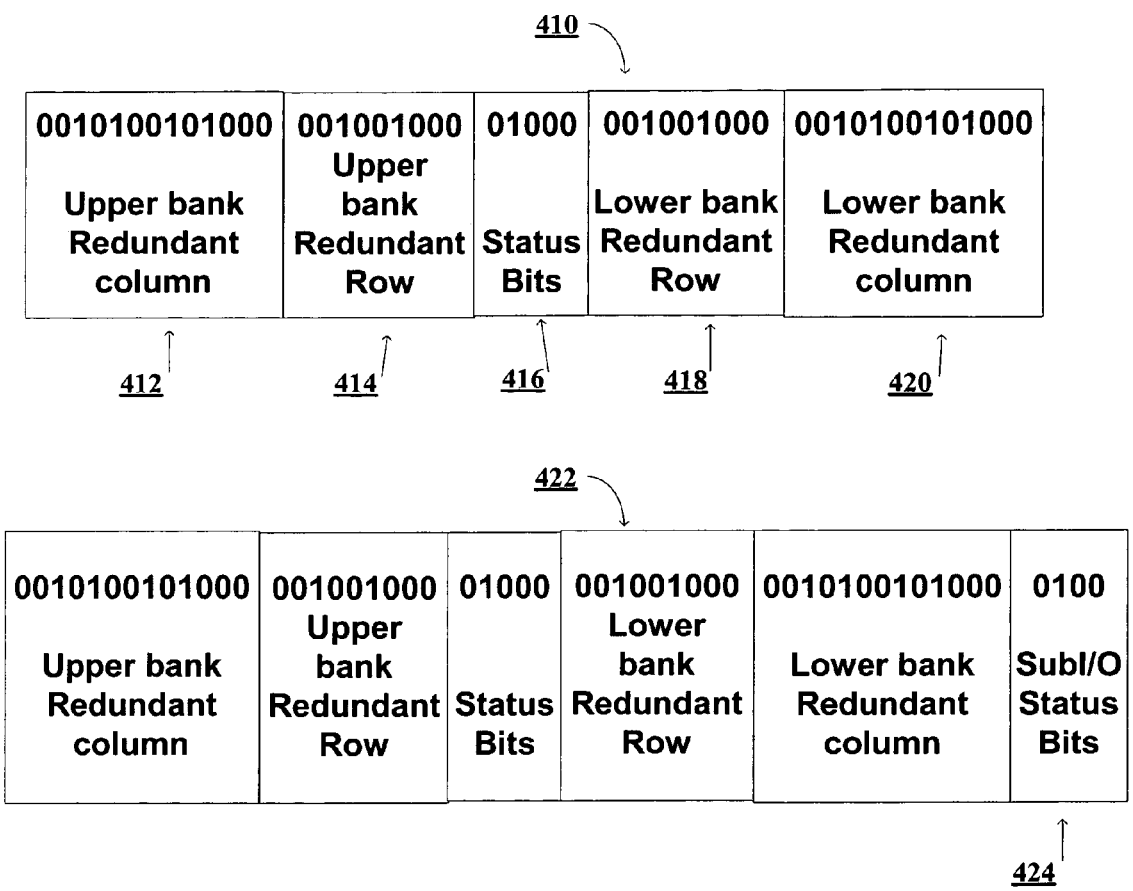
FIG. 4b illustrates various embodiments of exemplary repair signatures.

FIG. 4b illustrates various embodiments of exemplary repair signatures. As noted above, a repair signature may be a sequentially coded string of binary data. After an algorithm tests the memory to find defects and a redundancy allocation algorithm attempts to repair the detected defects, then the reconfiguration logic generates a repair signature. The content of the repair signature may convey information such as locations of faulty components detected, the amount of redundant components to repair the defects, and the allocation status of the redundant components, as well as other similar information. The Reconfiguration Data logic 310 may read header information in the repair signature to decode the existing repair signature to obtain the information encoded in the repair signature.

Figure 7:
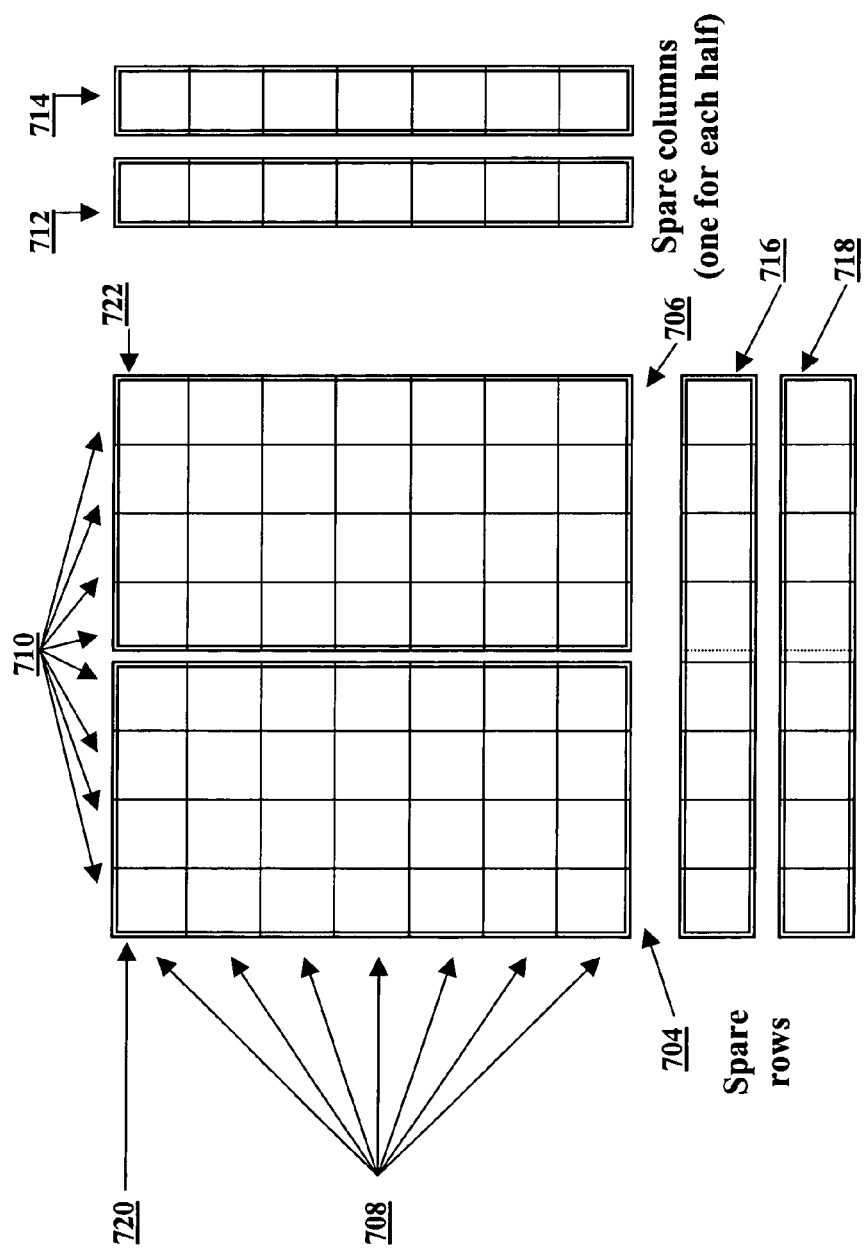
FIG. 7 illustrates an embodiment of a block diagram of a memory array split into banks and redundant components associated with that memory array.

As illustrated in FIG. 7, a memory array may be split into an upper bank, a lower bank, and redundant components associated with that memory array. The addresses for the memory cells in each bank may be mapped in a grid pattern of columns and rows.

Referring to FIG. 4b, a first exemplary repair signature 410 contains in the first section of the signature data bits 412 which convey address locations of defects in the columns of the lower bank in the memory, the amount of redundant columns for the lower bank of the memory, and the availability for those redundant columns. The data bits in the second section 414 convey similar information relating to the rows in the lower bank of the memory. The data bits in the fourth section 418 and fifth section 420 convey similar information relating to the columns and rows in the upper bank of the memory. The data bits in the third section 416 convey information relating to the state of decision for assigned redundant components.

A second exemplary repair signature 422 contains five sections similar to the first repair signature as well as a sixth section 424. The data bits in the sixth section 424 convey information relating to the amount of sub input-output circuits that exist in the memory and the location of location of faulty components within the sub input-output circuits.

Figure 4C:
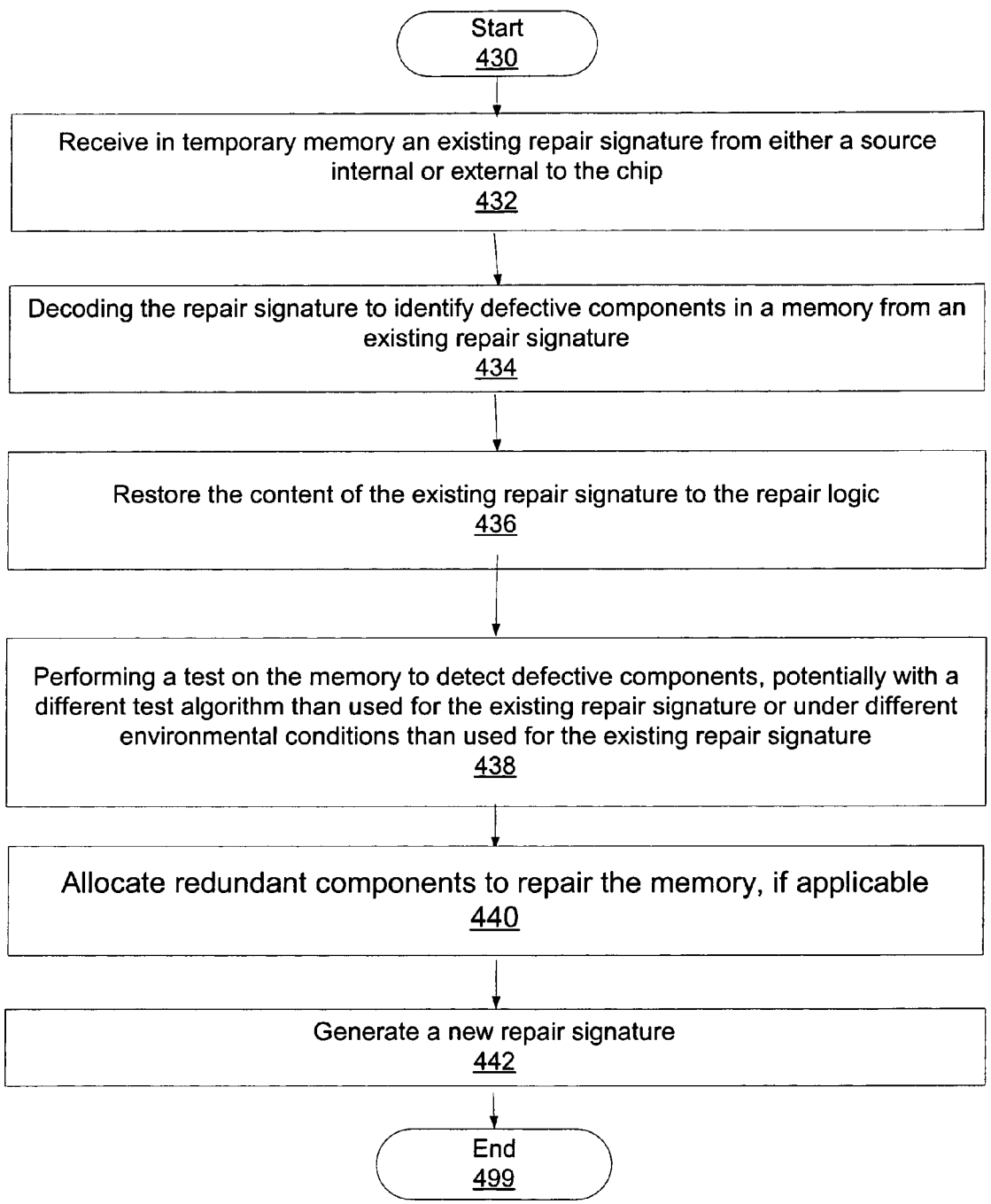
FIG. 4c illustrates a flow diagram of an embodiment to augment an existing repair signature.

FIG. 4c illustrates a flow diagram of an embodiment to augment an existing repair signature. In an embodiment, the reconfiguration logic or another similar logic block performs these operations.

In block 402, the logic receives in temporary memory an existing repair signature from either a source internal or external to the chip.

In block 404, the logic decodes the existing repair signature to identify information such as defective components in a memory from the existing repair signature. In an embodiment the logic reads header information to decode the information.

In block 406, the logic restores the content of the existing repair signature to registers associated with the redundancy allocation logic.

In block 408, the logic initiates test on the memory to detect any locations of faulty components in the memory. In an embodiment, the test algorithm may be different than the test algorithm used for the existing repair signature or under different environmental conditions than used for the existing repair signature. In an embodiment, the logic sequentially tests the memory for defects under a first environmental condition, then tests the memory for defects under a second environmental condition, decodes the defects detected by the first test, allocates redundant components are still available to allocated, and then executes a repair upon the memory to generate a second repair signature that repairs all of the defects identified by the first repair algorithm as well as by the second repair algorithm. The logic may test the memory the memory for defects under multiple environmental conditions and/or types of test algorithms and use the combined test information from each test to generate a repair signature vice testing the memory under a single standard condition such as normal temperature, normal operating voltage level and at normal speed/frequency.

In block 412, the logic allocates redundant components to repair the memory, if applicable. If defects are detected that require additional redundant components to repair the memory, then additional redundant component are assigned.

In block 414, the logic generates an augmented repair signature. In an embodiment, the augmented repair signature repairs defective components identified in the first repair signature as well as defective components detected during the test conducted in block 408.

In an embodiment, the existing repair signature may be burned into the fuse box. In an embodiment, the fuse box consists of programmable non-volatile memory and the new repair signature may be written into the fuse box to generate the new repair signature. In an embodiment, the new repair signature may supplement the permanent content in the fuse box. The reconfiguration logic stores the results of the new repair algorithm in volatile memory. The reconfiguration logic may be interposed between scan chain registers located inside the memories that control redundancy implementation and the fuse boxes located outside the memories which permanently store the content to be nominally shifted into the scan chain registers. The reconfiguration logic may compare the content in the fuse box and the data from the new repair algorithm in order to generate the augmented repair signature. The augmented repair signature is sent into the scan chain registers.

Figure 5:
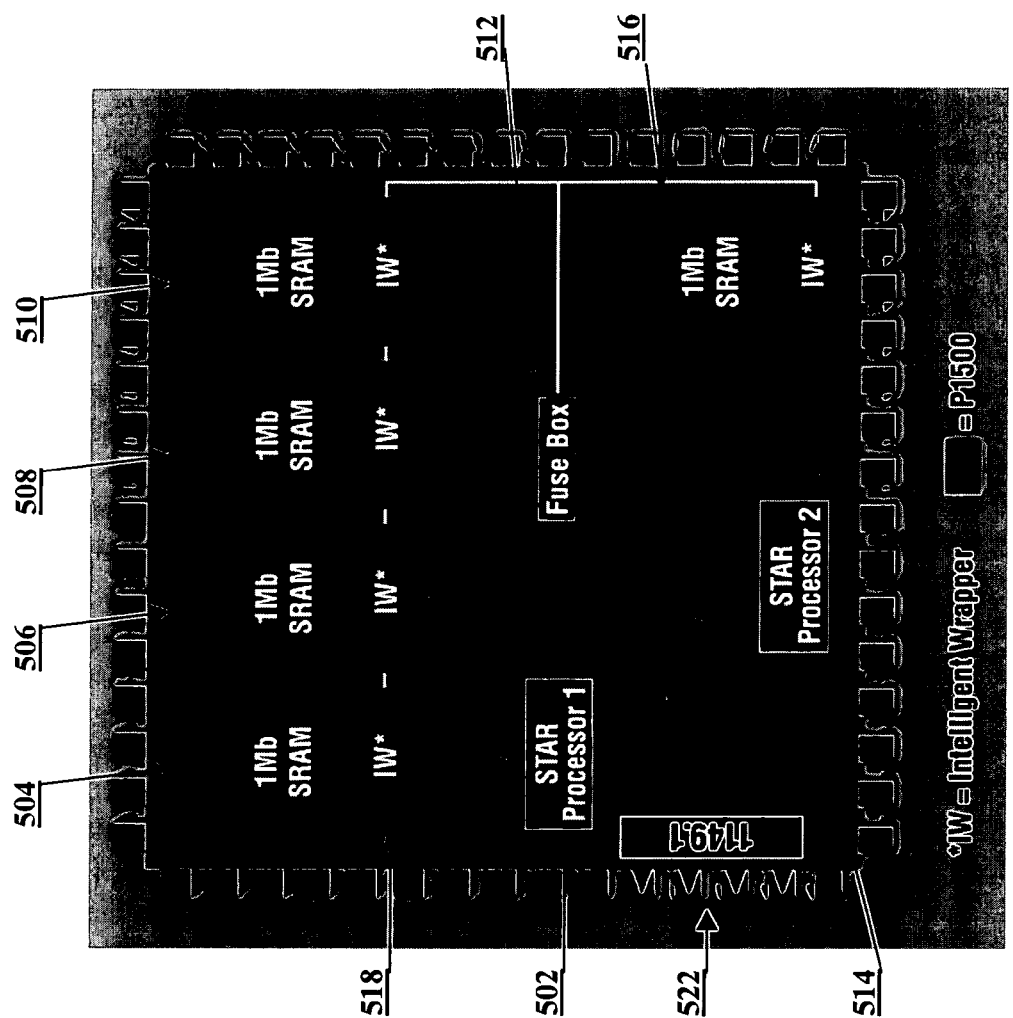
FIG. 5 illustrates a block diagram of an embodiment of one or more processors to test and repair several memory instances, either running in parallel or one at a time.

FIG. 5 illustrates a block diagram of an embodiment of one or more processors to test and repair several memory instances, either running in parallel or one at a time. The first processor 502 couples to a first memory 504, a second memory 506, a third memory 508, and a fourth memory 510. The first processor 502 may test all four memories 504, 506, 508, 510 one at a time or in parallel. The first processor 502 generates a discrete repair signature for each of the four unique memories. The first processor 502 can both send the repair signatures to the fuse box 512 for all four unique memories 504, 506, 508, 510 or send the repair signatures directly into scan chain registers in each unique memory 504, 506, 508, 510. The second processor 514 may couple to a fifth memory 516 and the fuse box 512. In an embodiment, all of the memories 504, 506, 508, 510, 516 may be the same size, such as one megabyte of SRAM, or not necessarily the same size. Accordingly, the size and redundancy structure of the fifth memory 516 may be different, such as five hundred and twelve kilobytes, than the first group of memories 504, 506, 508, 510. Placement of the memory instance and processor on the chip are dependent on several factors, such as area, power, speed, system clock, busses and the chip's floor plan. A single fuse box 512 can serve all memory instances on the chip.

In an embodiment, an extension of the processor is the Intelligent Wrapper (IW) 518 for example, at the first memory. The intelligent wrapper 518 associated with each memory instance 504, 506, 508, 510 is used in conjunction with the processor 502 to perform test and repair of the memory as well as allow normal memory functioning in the system. The intelligent wrapper 518 contains functions such as address counters, registers, data comparators and multiplexors. The intelligent wrapper 518 is located close to the memory core to allow at-speed testing of these functions. Thus, the processor 502 in conjunction with its intelligent wrapper 518 increase useable memory yields due to the processor's 502, 514 ability to detect nearly all defects, including performance defects that external memory testers commonly miss because they cannot run tests at chip speed. Further, the processor's 502, 514 on-chip repair function allows in the factory repairs and in the field repairs. The external interface 522, such as the standard JTAG 1149.1 port, enables the one or more processors to communicate with the chip's other IP cores.

Figure 6:
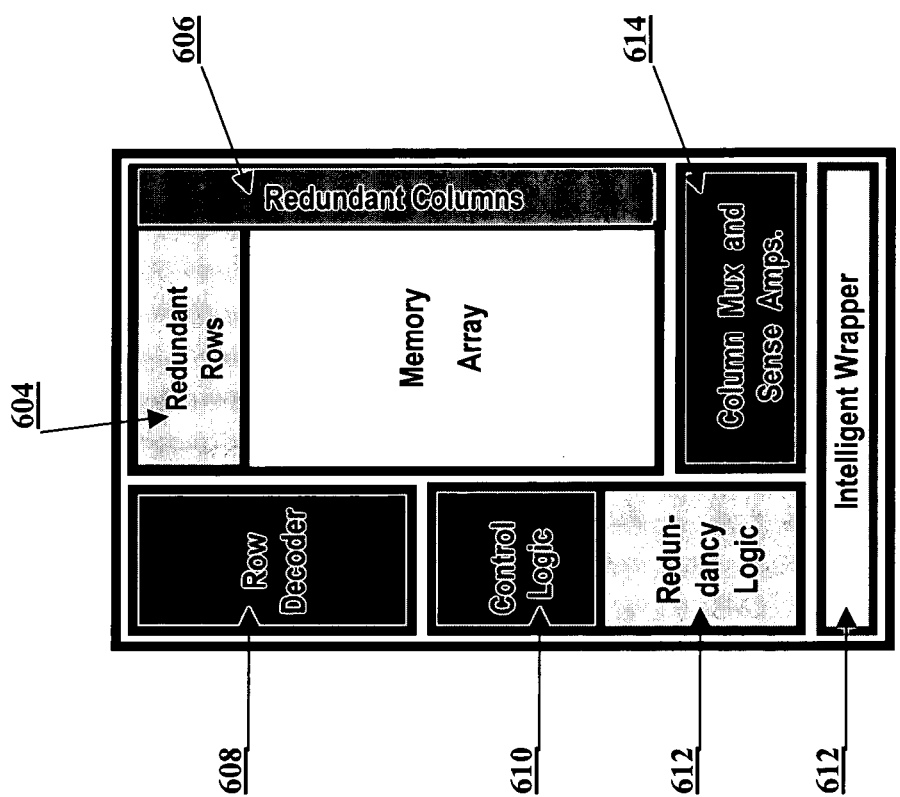
FIG. 6 illustrates a block diagram of an embodiment of a memory.

FIG. 6 illustrates a block diagram of an embodiment of a memory. In an embodiment, a memory may contain components such as the memory array 602, redundant rows 604, redundant columns 606, row decoders 608, control logic 610, redundancy logic 612, column multiplexors and sense amplifiers 614. The memory may be coupled with the intelligent wrapper 616. The memory array 602 may consist of memory bit cells organized by rows and columns. The row decoder 608 generates an address for a specific bit cell or grouping of bit cells such as a word line. The column multiplexors and sense amplifiers 614 read and write data signals into specific locations within the memory array 602 based upon the signal from the row decoder 608. The redundant rows 604 and redundant columns 606 substitute for defective components within the memory. For example, the memory may have a defective memory cell or a defective input output circuit coupling to that memory cell and depending upon the algorithm the processor may replace that defective component with a redundant row 604 or redundant column 606. The redundancy logic 612 coordinates the substitution of the non-redundant components with redundant components.

FIG. 7 illustrates an embodiment of a block diagram of a memory array split into banks and redundant components associated with that memory array. The memory array 700 contains memory cells. In an embodiment, the memory cells are organized by bank 704, 706, comprised of row 708, and columns 710. Each memory array 700 may be split up, for example, a lower bank 704 and an upper bank 706, for organization purposes. The lower bank 704 contains seven rows 708, e.g. horizontal word lines of memory cells, and four columns 710, i.e. vertical bit lines. A memory array 700 may be split up into any number of banks but two will be illustrated and described to demonstrate aspects of the invention. The memory array 700 may have one or more redundant columns 712, 714 and one or more redundant rows 716,718. A memory array 700 may have any number of redundant components but two rows and two columns will be illustrated and described to demonstrate aspects of the invention. A first redundant column 712 may substitute for a defective column in the lower bank 704. A second redundant column 714 may substitute for a defective column in the upper bank 706. A first redundant row 716 may globally substitute for a defective row in either the lower bank 704 or the upper bank 706. For example, if two defects exist in the top word line 720 in the lower bank 704, such as the top set of four horizontal memory blocks contained in the lower bank 704, then the first redundant row 716 may be globally substituted for the top word line 720 in the lower bank 704 and the top word line 722 in the upper bank 706. Similarly, a second redundant row 718 may globally substitute for a defective row in either the lower bank 704 or the upper bank 706 or both. In an embodiment, the BIRA algorithm may march through lower bank while simultaneously in parallel march through the upper bank.

Figure 8:
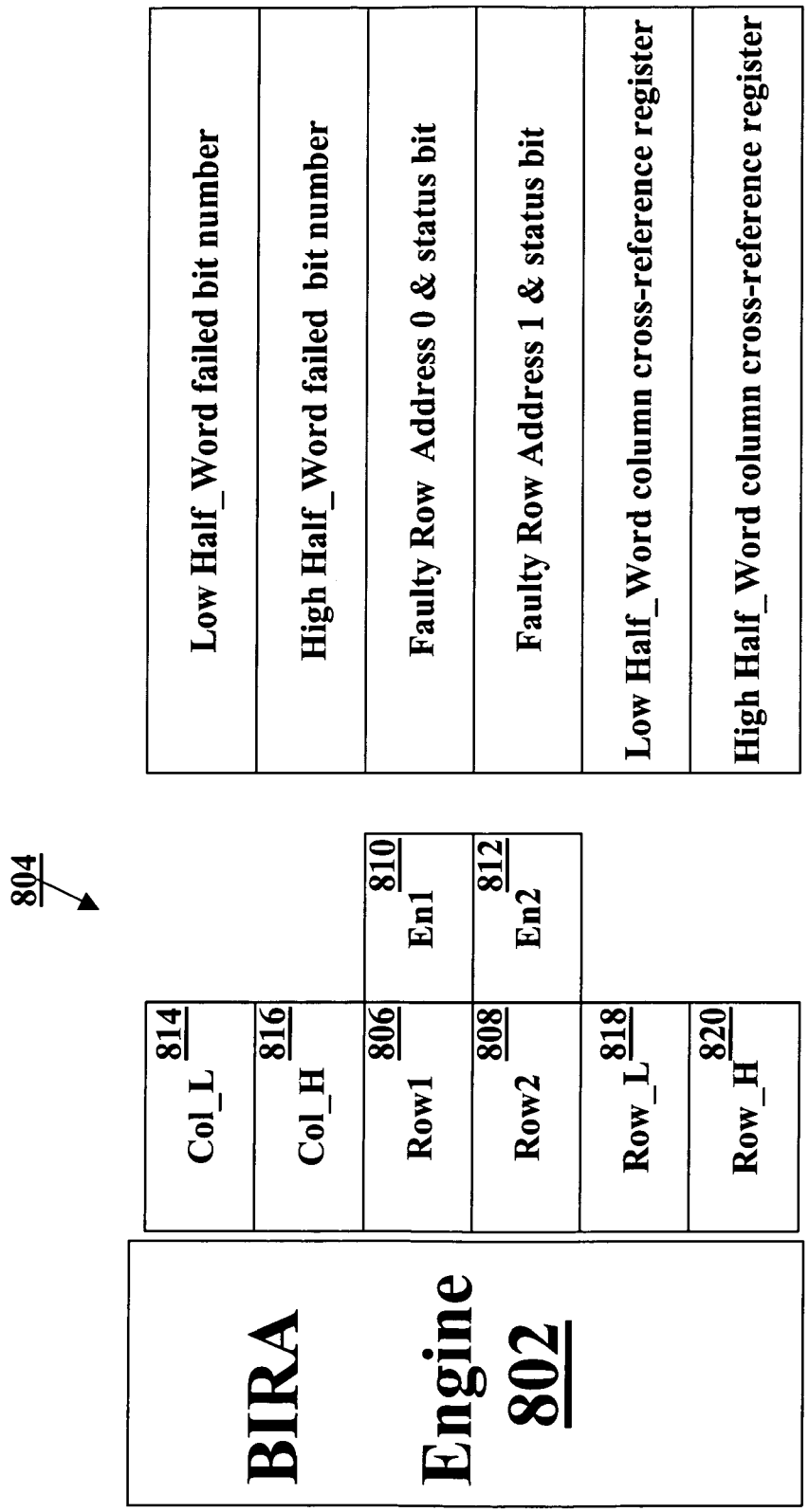
FIG. 8 illustrates an embodiment of a block diagram of the built in redundancy engine having a plurality of registers.

FIG. 8 illustrates an embodiment of a block diagram of the built in redundancy engine having a plurality of registers. The Built-In Redundancy Analysis (BIRA) engine 802 allocates the redundant components, such as one or more redundant columns and the one or more redundant rows. After detecting a defective cell in the memory array, the BIST engine sends the corresponding macro-cell address of the defective cell to the engine implementing one of the BIRA algorithms. The processor explores the contents of the set of registers 804 where the information for final self-repair is stored and changes the contents if necessary. If the memory is diagnosed as repairable the final contents of the registers contain the addresses of rows and columns to be replaced with the corresponding spare elements.

In an embodiment, the plurality of registers may be as follows. Row register-Row_1 806, and row register Row_2 808 record the faulty row addresses. Thus, each row register 806, 808 may identify and store the address of a faulty row. In an embodiment, the amount of row registers equals the number of redundant rows. Status bit register-En1 810 and status bit register-En2 812 record the status of redundant row registers. These status bits indicate that the corresponding addresses recorded must be selected for repair if the memory is declared repairable after BIST. Thus, the status bit registers 810, 812 indicate whether the corresponding redundant row is available or unavailable as a substitute row. In an embodiment, the BIST and BIRA operations are performed simultaneously.

Similarly, status bit register-CL (not shown) and status bit register-CH (not shown) record the status of redundant column registers. The status bit registers indicate whether the corresponding redundant column is available or unavailable as a substitute column. Column register Col_L 814 and column register Col_H 816 record the faulty column addresses located in the lower bank and upper bank, respectively. In an embodiment, the total amount of status bit registers equals the number of redundant rows plus the number of redundant columns.

Cross-reference row register-Row_L 818 and cross-reference row register Row_H 820 record the row addresses connected with the faults recorded in column registers Col_L 814 and Col_H 816. Each cross reference register allows an assigned redundant column, thus unavailable, to be released and reset to available status, if an assigned redundant row will also be substituting for the defective memory cell that the assigned redundant column was substituted for. In an embodiment, the BIRA engine 802 may couple to additional registers, such as sub input output registers which together with the column registers 814, 816 specify the faulty column addresses of sub input output circuits associated with each memory array.

The BIRA engine 802 processes one or more built-in-redundancy-analysis algorithms to determine whether a memory is repairable. The BIRA engine 802 takes into consideration the process failure history, address mapping, and examines information about available redundancy, and the current fault data that is specific to each unique memory. The BIRA engine 802 combines this information and sends the information to the Reconfiguration Data engine to translate the redundancy allocation into a memory-specific repair signature.

In an embodiment, the organization and sequence of how the BIRA engine 802 assigns the redundant components determines whether a memory array will be repairable or not repairable, thereby, increasing or decreasing the yield of useable memories on the chip. The BIRA engine 802 may use many discrete algorithms, however, a one or more algorithms will be described and illustrated to demonstrate aspects of the invention.

A first Built-In-Redundancy-Analysis algorithm is based on the following main logic steps.

First, if at least two faulty cells are encountered in a word either in the lower bank or the upper bank of the memory array, then the row requires repair with a redundant row. If an available redundant row does not exist, then the memory array is considered unrepairable.

Second, if a single faulty cell is encountered in a word either in the lower bank or the upper bank of the memory array then a redundant column is used for repair, if available. If no spare column is available but a spare row is available, then a redundant row is used for repair. Otherwise, the memory array is considered unrepairable.

Third, the BIRA engine 802 works in parallel with the BIST logic providing the fault data. Thus, the BIRA engine 802 may possess three states of decision regarding the assignment of redundant components to substitute for defects in the memory detected by BIST logic. In an embodiment, the three states of decision are not set, tentatively set, and locked in. The starting state of decision for redundant rows and redundant columns is not set. Not set means that the component is available to be assigned to substitute for a defective component.

As noted in the first logic step, if at least two faulty cells are encountered in a word, then a redundant row is assigned to substitute for the defective component. In this case, the BIRA engine 802 locks in the state of decision for this redundant row to substitute for the defective row. Thus, this particular redundant row is now unavailable to be assigned to replace another defective component. Note, the redundant row globally replaces the entire row in both the lower bank and the upper bank irrespective of whether the two fault cells exist in the upper bank or in the lower bank or in both.

As noted in the second logic step, if a single faulty cell is encountered in a word, then a redundant column is the first choice to substitute for the defective component. The BIRA engine 802 tentatively sets the state of decision for this redundant column to substitute for the defective component. Thus, this particular redundant column is currently unavailable to be assigned to replace another defective component; however, the status of this redundant column may be released back to available upon certain conditions. If a new fault is encountered requiring repair with a redundant row, (i.e. at least two faulty cells are encountered in a word) and a faulty row is connected with an assigned redundant column, i.e. the corresponding cross-referencing registers contain the same address as the faulty row, then the corresponding column register is reset together with the status bit register and cross referencing register. The released redundant column has become available for further repair purposes and the newly assigned redundant row satisfies the first logic step to have a locked in state of decision. If an available redundant row does not exist, then the memory array is considered unrepairable.

Fourth, the BIRA algorithm may use a marching algorithm, which sequentially examines the addresses of the memory array. The BIRA algorithm may make several passes to attempt to repair a memory. If at least one of the BIRA algorithms passes eliminates all of the defective components in the memory through redundant component substitution, then the state of decision for each redundant memory component is locked in. The memory is repaired. The BIRA engine 802 sends the repair information to the Reconfiguration Data generation engine.

Figure 9:
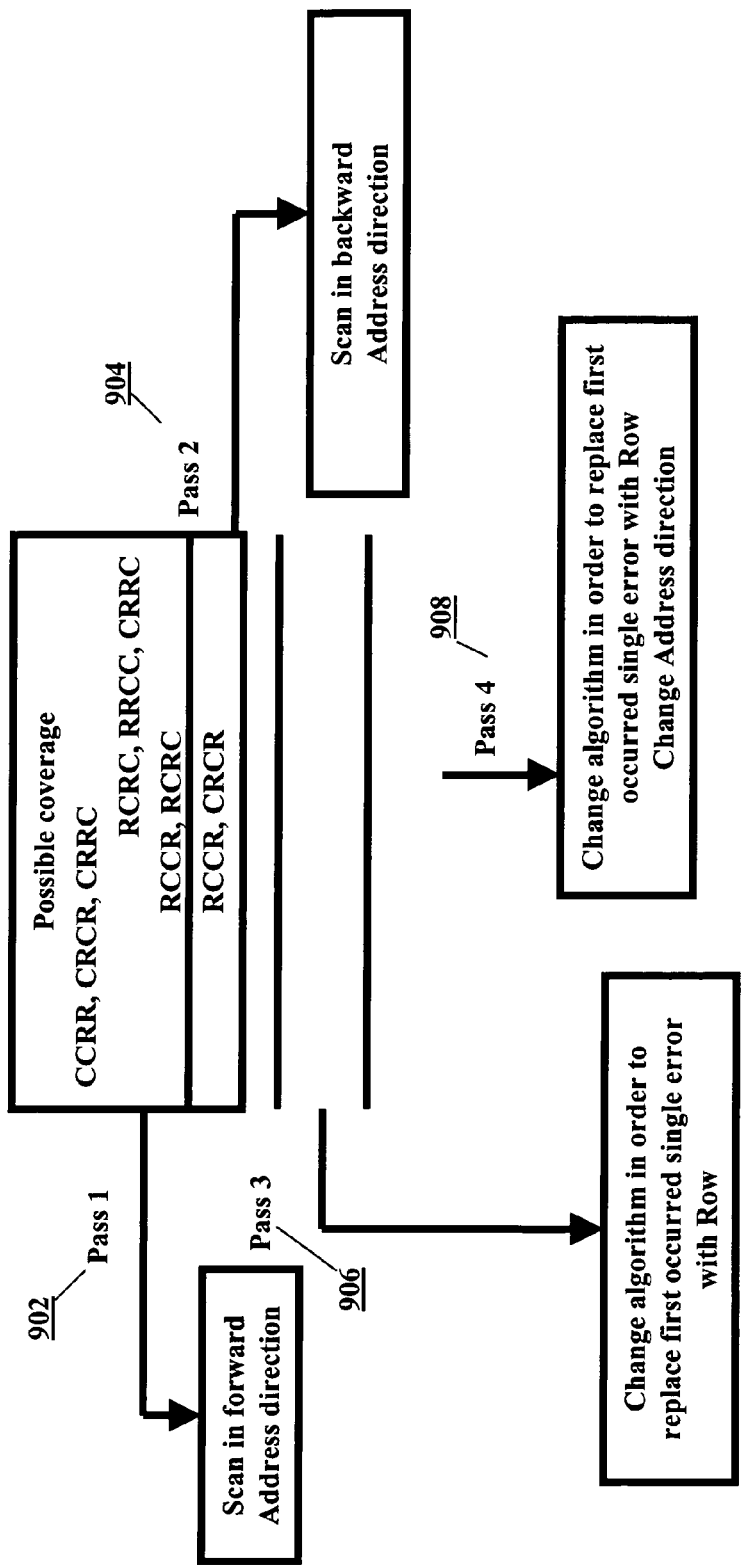
FIG. 9 illustrates a block diagram of an embodiment of a testing pattern for an embodiment of a BIRA algorithm.

FIG. 9 illustrates a block diagram of an embodiment of a testing pattern for an embodiment of a BIRA algorithm. Note, the BIRA algorithm may contain testing patterns to make one or more passes but a four-pass routine will be used as an example. On the first pass 902, the BIRA algorithm sequentially examines the memory array to substitute redundant component for defective components. The BIRA algorithm examines the memory array in the forward direction. Thus, the BIRA algorithm starts examining the lowest memory address and marches sequentially through to the highest memory address of the memory array under analysis. On the second pass 904, the BIRA algorithm examines the memory array in the backward direction. Thus, the BIRA algorithm starts examining the highest memory address and marches sequentially through to the lowest memory address of the memory array under analysis.

On the third pass 906, the BIRA algorithm alters the second logic step to choose to replace a single defective memory cell with a redundant row rather than a redundant column. The BIRA engine sets the state of decision for that assigned redundant row as tentatively set. On the fourth pass 908, the BIRA algorithm does both alter the second logic step to choose to replace a single defective memory cell with a redundant row rather than a redundant column and examines the memory array in the backward direction.

Figure 10:
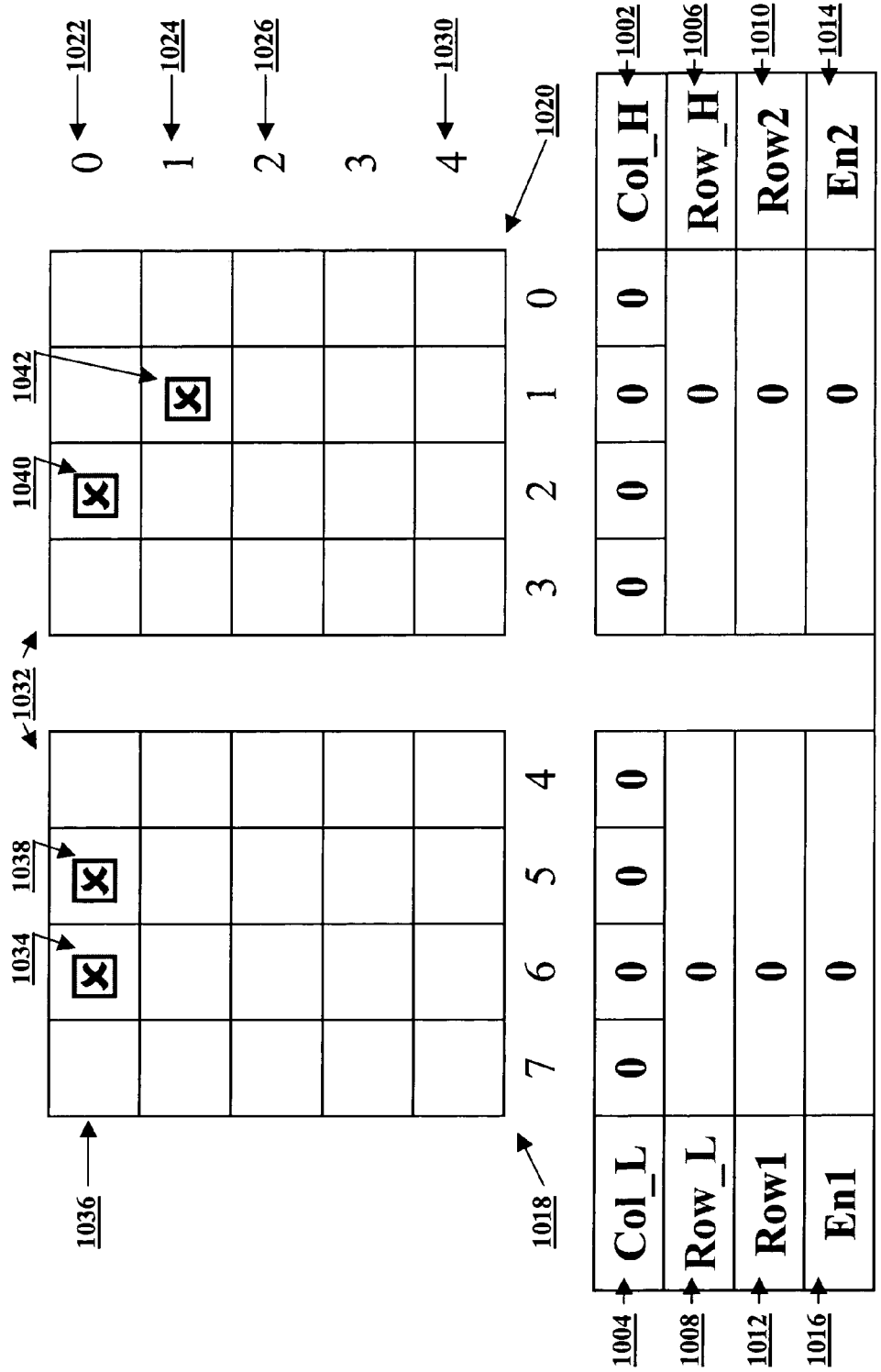
FIG. 10 illustrates an embodiment of an exemplary starting condition for the BIRA registers in generating an augmented repair signature.

FIG. 10 illustrates an embodiment of an exemplary starting condition for the BIRA registers in generating an augmented repair signature. In an embodiment, the starting condition for the BIRA registers, is a logical "0" contained within all of the registers. Thus, the column registers 1002, 1004 contain a starting status of "0". Similarly cross-reference registers 1006, 1008, the row registers 1010, 1012, and the status bit registers 1014, 1016 all contain a starting status of logical "0".

The memory array 1032 is split into two halves a lower bank 1018 and an upper bank 1020. Many word lines exist in each bank. For example, the top horizontal grouping of memory blocks is a word line, in the lower bank 1018. Similarly, the top horizontal grouping of memory blocks in the upper bank 1020 is an example of a word line. The row address spans from row address 0 through row address 4 1030. And the column address spans from address 0 through address 7. Note this is just an exemplary memory array 1032 and how a first BIRA algorithm might be employed.

The BIST program sends data to the BIRA engine indicating the location of faulty memory cells, such as a first faulty memory cell 1034 located in the first word line 1036 contained within the lower bank 1018. The first BIST test under a first set of environmental conditions detects four defects in the memory. The first faulty memory cell 1034 is located at row address 0 and also at column address 6. Located next to the first faulty cell 1034, going horizontally, is a second faulty memory cell 1038 constituting a second fault or defect with in the first word line 1036. In an embodiment, when the BIRA algorithm encounters two faulty cells in a single word line, a first logical steps dictates that a redundant row will be substituted for the defective component. The third faulty memory cell 1040 is located at row address 0 and column address 2. The fourth faulty memory cell 1042 is located at row address 1 and column address 1. The BIST logic communicates the faulty cell information to the BIRA logic.

A faulty memory cell could be an actual faulty defective bit cell within the memory, a defective multiplexor or sense amp going to that bit cell, a faulty input output circuit routing to that cell, some interconnection between those components going to that cell or some other condition to render the memory location inoperable. In an embodiment, a redundant component, such as either the redundant row or the redundant column, has the necessary components within the redundant component to substitute for any of those defects.

The exemplary use of the BIRA algorithm assumes that the memory array 1032 has two redundant columns, a first redundant column and a second redundant column as shown in FIG. 7. The exemplary use of the BIRA algorithm also assumes that the memory has two redundant rows, a first redundant row and a second redundant row. Additionally assumed is that the memory array 1032 has been split into an upper bank 1020 and a lower bank 1018. The specific amounts of components and the types of components are just examples to illustrate an embodiment of the invention. One or more of any of these components could exist. In an embodiment, the BIRA algorithm examines these variables as shown in FIG. 4.

Figure 11:
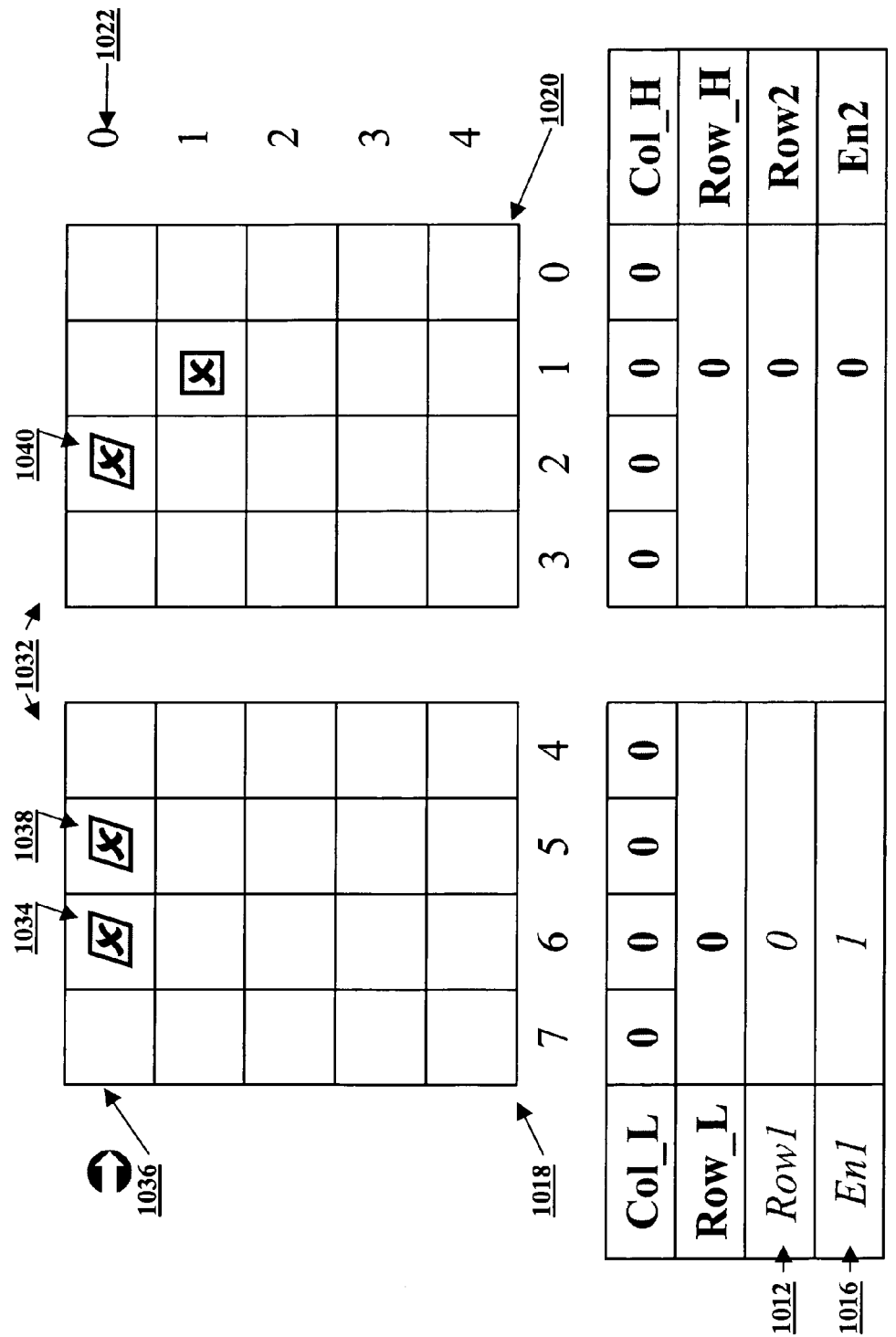
FIG. 11 and FIG. 12 illustrate an exemplary use of a first BIST algorithm and a first BIRA algorithm using the first pass to detect errors and perform redundancy allocation in the memory array.
Figure 12:
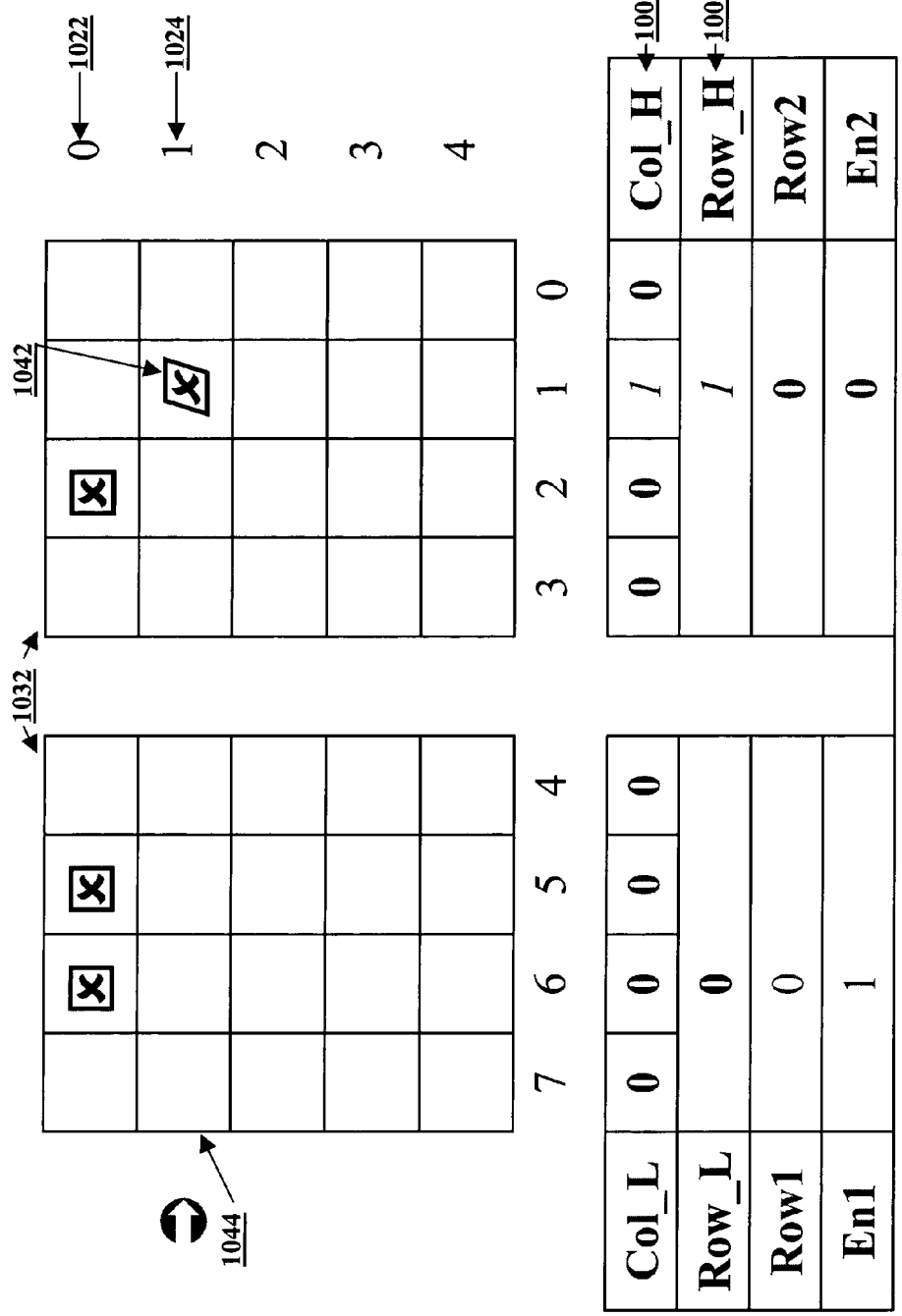

FIG. 11 and FIG. 12 illustrate an exemplary use of a first BIST algorithm and a first BIRA algorithm using the first pass to detect errors and perform redundancy allocation in the memory array.

Referring to FIG. 11, the BIRA algorithm starts examining at the lowest memory address and works its way to the highest memory address. In an embodiment, the BIRA algorithm examines the lower bank 1018 simultaneously with the upper bank 1020. However, for ease of explanation the lower bank 1018 and upper bank 1020 are sequentially examined. At the same time the BIRA algorithm conducts its fault analysis, the BIRA algorithm also assigns redundant components. The BIRA algorithm starts by detecting two defect, faulty memory cells 1034 1038, in the first word line 1036. Thus, according to the first logical step when multiple errors are encountered, the defective component, in this case, a defective row, is substituted with a redundant row. Therefore, the first redundant row is substituted for the defective row in row address 0 1022. To reflect these changes, the BIRA engine changes the contents in row register-Row1 1012 to record the address of the faulty row, in this case row address-0 1022. Further, the BIRA engine changes the contents in status bit-En1 1016 to contain a logical 1. A logical 1 in status bit register-En1 1016 indicates that first redundant row is now unavailable as a substitute component. The algorithm continues to march sequentially through the memory addresses of the memory array 1032 and detects a third faulty memory cell 1040 in column address 2 in the upper bank 1020. The algorithm references the contents of row register-Row1 1012 to find out that this fault is already substituted by a redundant component. Thus, the BIRA algorithm proceeds down to the second word line 1044 contained in the lower bank 1018.

Referring to FIG. 12, the BIRA algorithm continues marching in a forward direction on the first pass through the addresses of the memory array 1032. The BIRA algorithm finishes its analysis of row address 0 1022 and starts its analysis of row address-1 1024. The BIRA algorithm detects a fourth faulty memory cell 1042 in the upper bank 1020 in the second word line 1044. The BIRA algorithm determines that this is a single faulty cell contained in a word line and therefore follows the second logical step to replace the single faulty cell with a redundant column. The BIRA engine changes the contents in column register-Col_H 1002 from a logical 0 to a logical 1 to indicate the column address of the defective component. The cross-reference register Row_H 1006 changes it's content to reflect a 1 which is the row address connecting or cross referencing the defective row with the defective column.

The BIRA algorithm then goes to the fourth logical step, once the highest memory address is achieved and checks to see if all the faults in this memory array 1032 were substituted by redundant components. In this example, the redundant components substitute for the defective components in order to replace every defect that occurred in this memory array 1032. The BIRA algorithm then determines that this memory array 1032 is repaired on the first pass. With the assigned redundant components substituting the defective components in place, the reconfiguration logic initiates a quality assurance BIST of the memory.

Once the BIRA algorithm determines that one of the passes or testing techniques, in this case the first pass, was successful, then the BIRA algorithm locks in the state of decision contained in the BIRA registers for each redundant component and sends the fault information onto the reconfiguration data engine. The BIRA algorithm may optimize the final organization and allocation of assigning redundant components in order to replace defective components associated with the memory. The reconfiguration logic reads the contents the BIRA registers to generate a repair signature such as a first repair algorithm.

Figure 13:
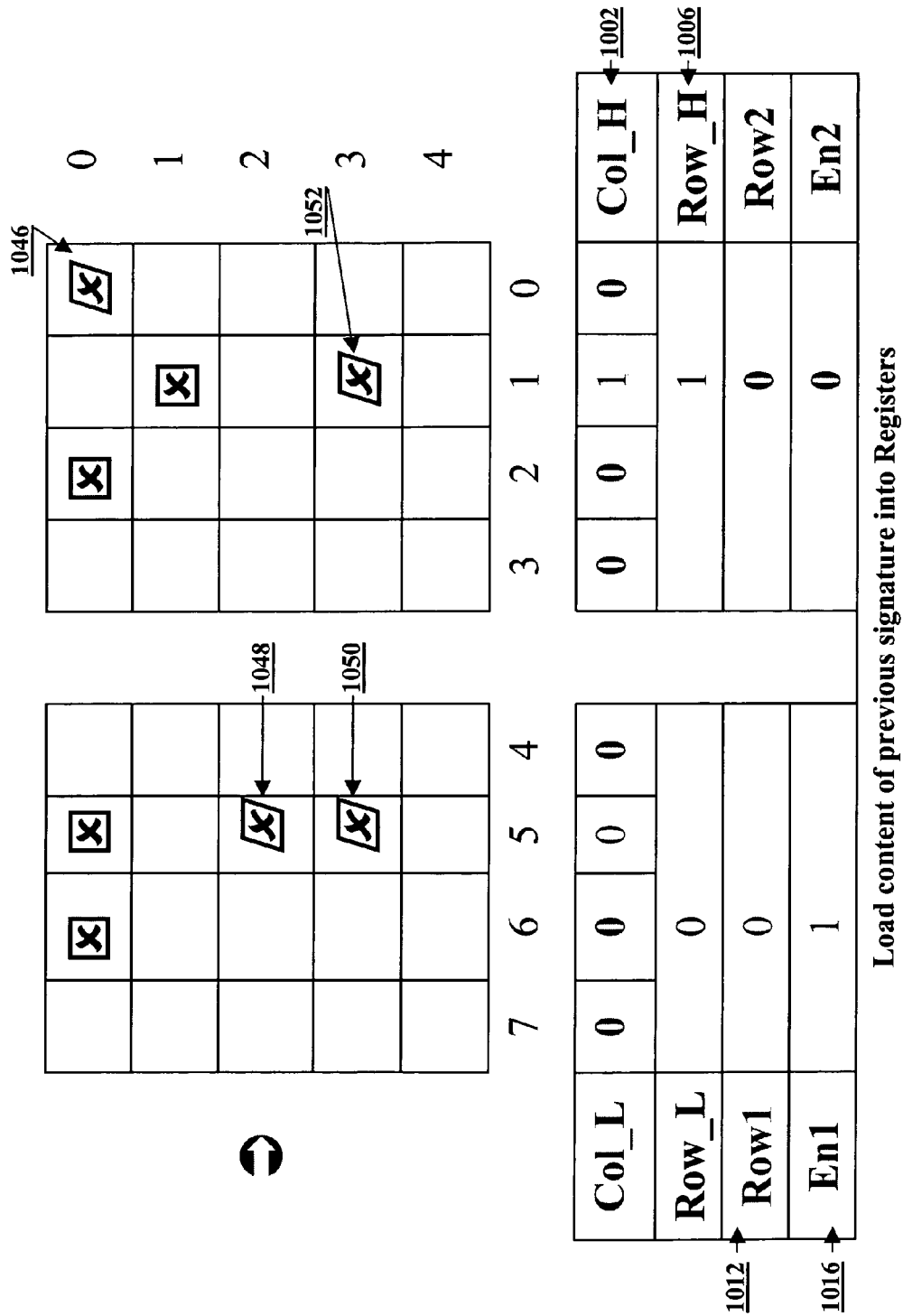
FIG. 13 and FIG. 14 illustrate the BIRA algorithm attempting to repair additional defects detected by a second test in order to augment the first repair signature.
Figure 14:
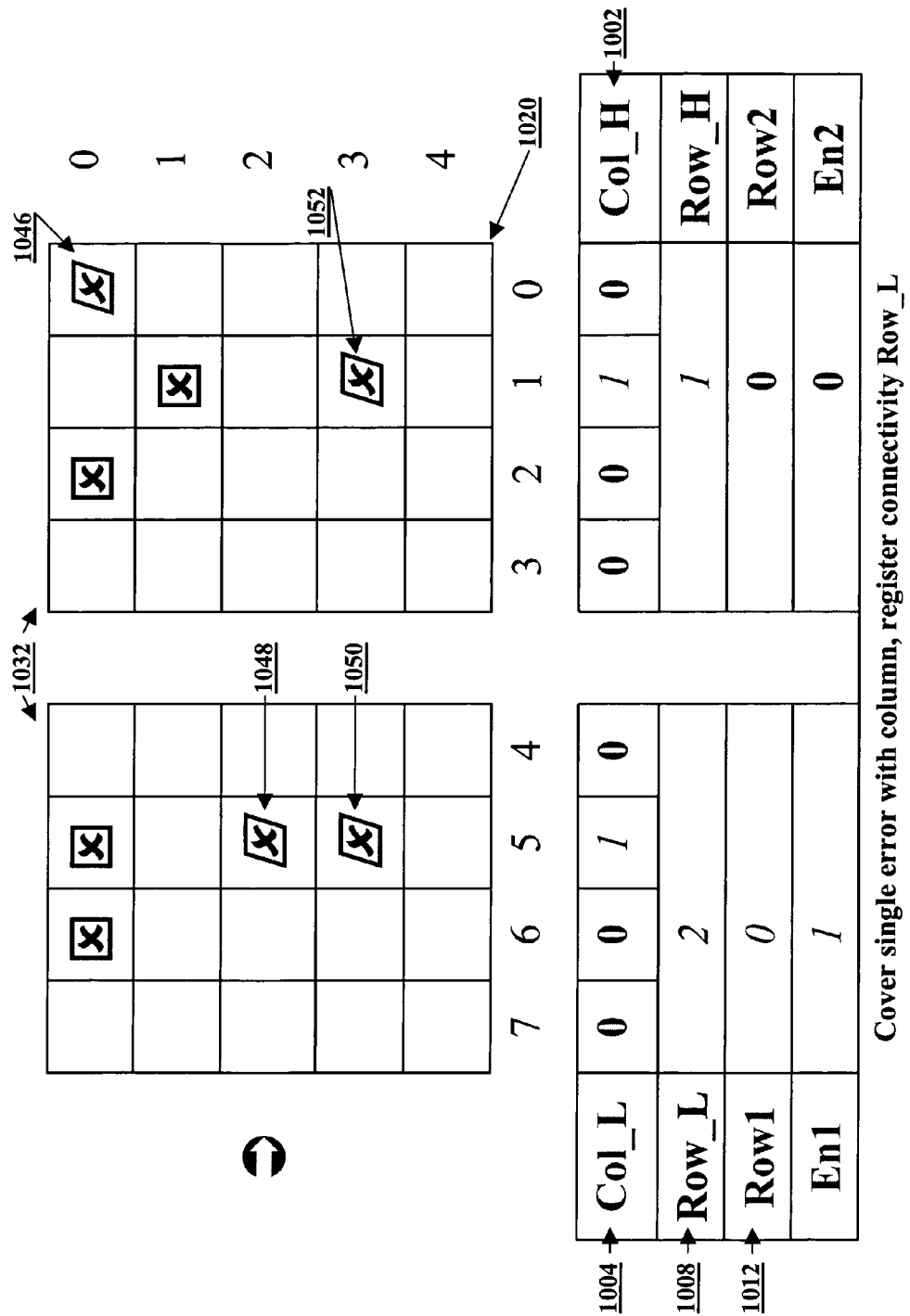

FIG. 13 and FIG. 14 illustrate the BIRA algorithm attempting to repair additional defects detected by a second test in order to augment the first repair signature.

Referring to FIG. 13, the second test detects four additional defects, the fifth faulty memory cell 1046 through the eighth faulty memory cell 1050. The second BIST may use a different type of test algorithm than the first BIST, test under different environmental conditions than the first BIST, or test at a later period in time than the first BIST. The second test may or may not detect the first four faulty memory cells; however, the fact that those defects exists is communicated when the contents of the first repair signature load into the BIRA registers.

The reconfiguration logic decodes the contents of the first repair algorithm and loads the contents into the corresponding BIRA registers. Column register-Col_H 1002 contains a logical 1 in the 1$^{st}$ row address slot to indicate that the column address either currently or previously contained a single defective component. Row register-Row1 1012 1002 contains a logical 1 to indicate that the row address either currently or previously contained a multiple defective components. The cross referencing bits 1006, 1016 may be used to further determine the exact address locations of previously identified faulty memory cells.

Referring to FIG. 14, the BIRA algorithm detects a fifth faulty memory cell 1046 in the row address 0 and column address 0. The algorithm references the contents of row register-Row1 1012 to find out that this faulty memory cell is already substituted by a redundant row.

The BIRA algorithm detects a sixth faulty memory cell 1048 in the row address 2 and column address 5. According to the second logical step, since the BIRA algorithm detects only a single error, the BIRA algorithm assigns a redundant column to substitute for the defective faulty component. Thus, the BIRA engine changes the contents in column register Col_L 1004 to record a logical 1 in memory block corresponding with fifth column address to indicate that the second redundant column has been assigned to substitute for the memory column in the fifth address slot. The BIRA engine changes the contents in cross reference register Row_L 1008 to record row address 2 1026, in order to reflect the row address corresponding to the defect which caused the redundant row to be assigned to that defective column. The second redundant column replaces the defective column in fifth address slot, which is reflected by the contents in the column register Col_L 1004 and cross reference register Row_L 1008.

The BIRA algorithm detects a seventh faulty memory cell 1050 in the row address 3 and column address 5. The BIRA algorithm references the BIRA registers and detects that the second redundant column has been assigned to substitute for this defective memory cell already through contents of column register Col_L 1004. In an embodiment, column status bit registers (not shown) for column register Col_H 1002 change their state of decision to locked-in to indicate that the corresponding redundant column is unavailable as a substitute column because the assigned redundant column now substitutes for at least two faulty memory cells not repaired by any other redundant component.

The BIRA algorithm then continues its forward march through the memory array 1032 and discovers a single defect being the eighth faulty memory cell 1052 located within the upper bank 1020 occurring in column address 1. The BIRA algorithm references the BIRA registers and detects that the first redundant column has substituted for this defective component already. The BIRA algorithm references the column register Col_H 1002 and detects that the contents reflect column address 1.

The BIRA algorithm then goes to the fourth logical step, once the highest memory address is achieved and checks to see if all the faults in this memory array 1032 were substituted by redundant components. In this example, the redundant components have substituted for the defective components in order to replace every defect that occurred in this memory array 1032. The BIRA algorithm then determines that this memory array 1032 is repaired. With assigned redundant components substituting the defective components in place, the reconfiguration logic initiates a quality assurance BIST of the memory.

Once the BIRA algorithm determines that one of the passes or testing techniques, in this case the first pass, was successful, then the BIRA algorithm locks in the state of decision contained in the BRA registers for each redundant component and sends the fault information onto the reconfiguration data engine. The reconfiguration logic reads the contents the BIRA registers to generate a repair signature such as a second repair algorithm.

Figure 15:
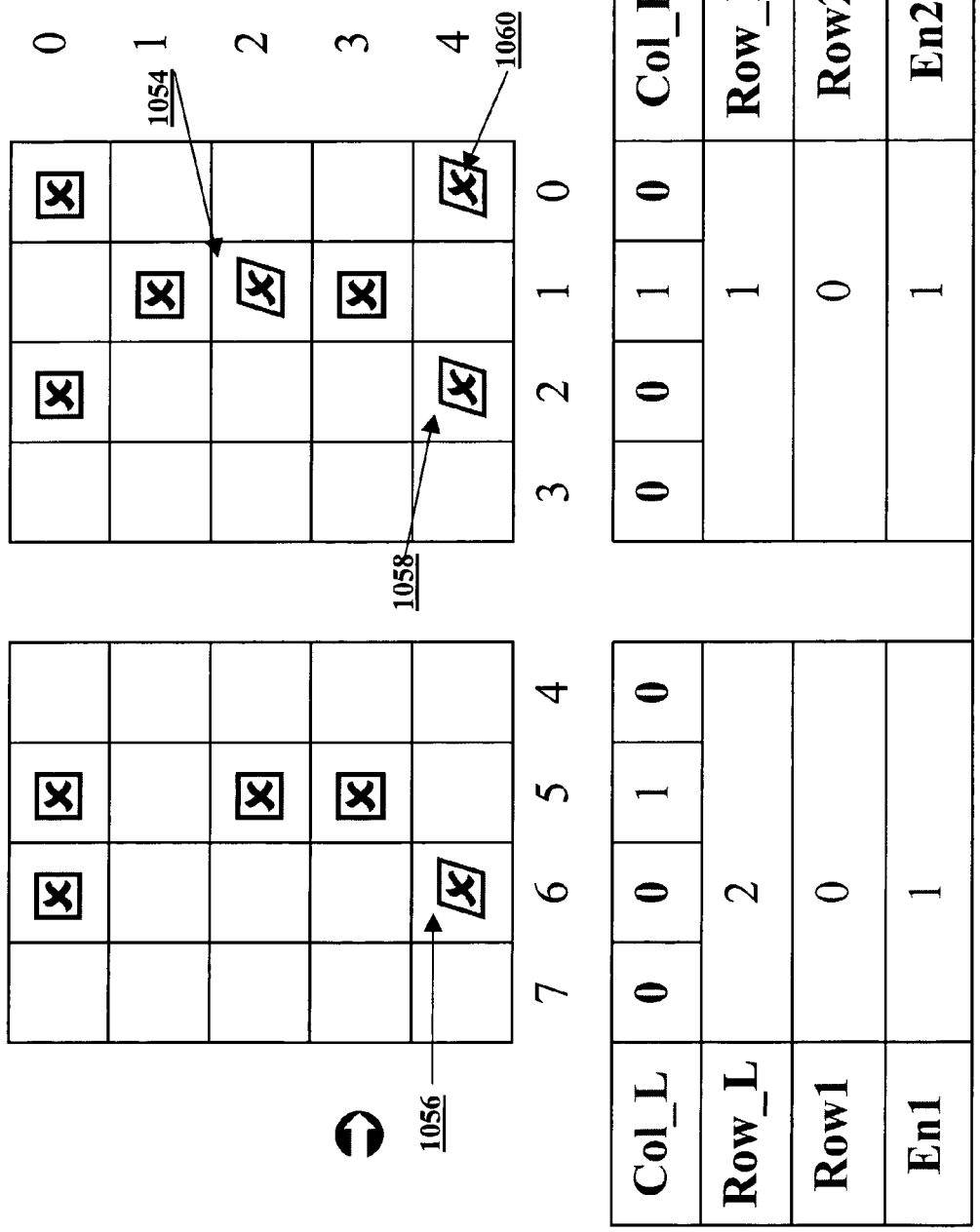
FIG. 15 and FIG. 16 illustrate the BIRA algorithm attempting to repair cumulative defects detected by a third test in order to augment the second repair signature.
Figure 16:
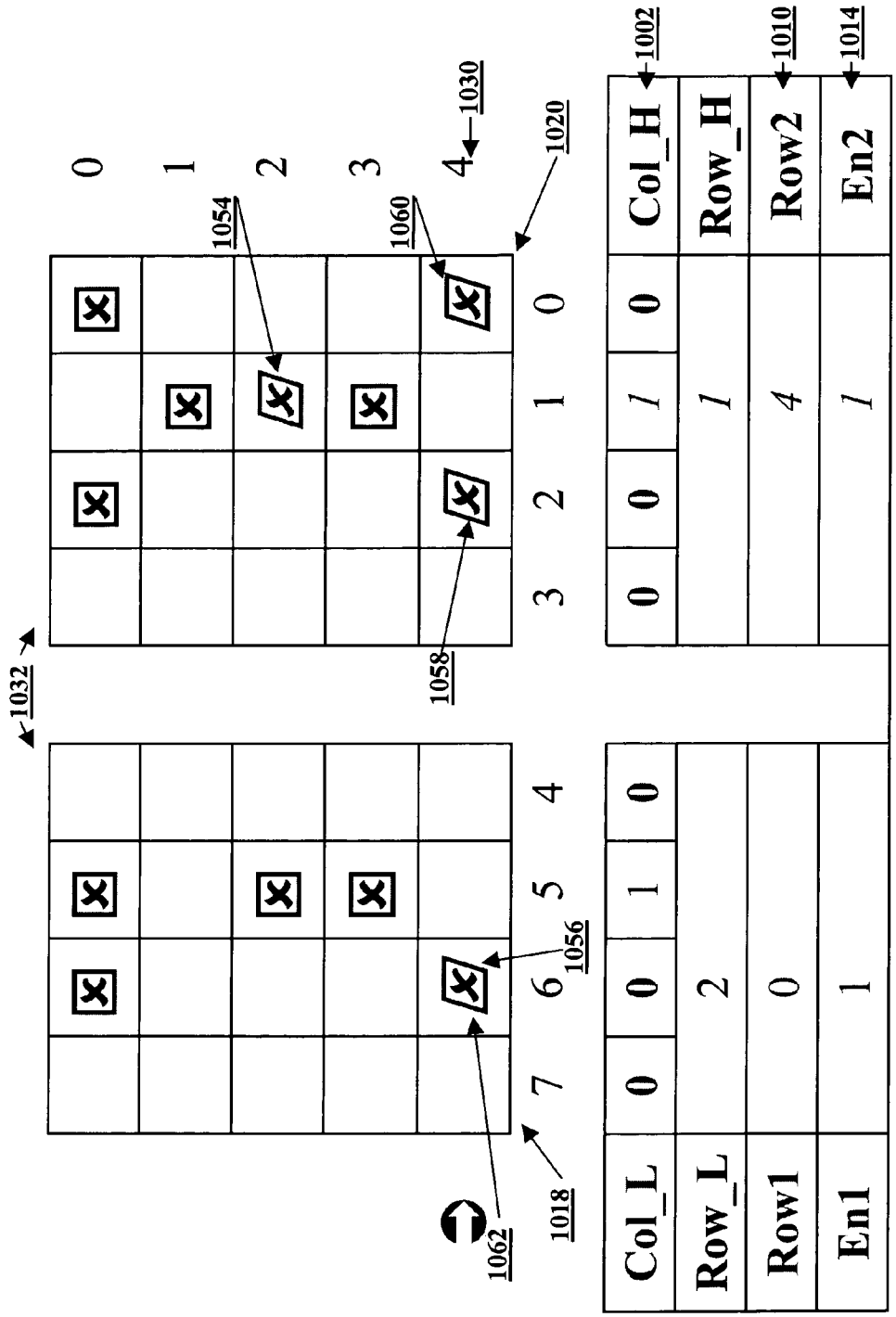

FIG. 15 and FIG. 16 illustrate the BIRA algorithm attempting to repair cumulative defects detected by a third test in order to augment the second repair signature.

Referring to FIG. 15, the second test detects four additional defects, the ninth faulty memory cell 1054 through the twelfth faulty memory cell 1060. The third BIST may use a different type of test algorithm than the first BIST, test under different environmental conditions than the first BIST, or test at a later period in time than the first BIST. For example, the third test of the memory may occur after the chip has been placed into operation and load in the second repair signature from the fuse box. The second test may or may not detect the first eight faulty memory cells; however, the fact that those defects exist is communicated when the contents of the second repair signature load into the BIRA registers.

Referring to FIG. 16, after the contents of the second repair signature load in to the registers, the BIRA algorithm begins to identify defects and assign redundant components. The BIRA algorithm detects a ninth faulty memory cell 1054 in the row address 2 and column address 1. The BIRA algorithm references the BIRA registers and detects that the first redundant column has been assigned to substitute for this defective memory cell already through contents of column register Col_H 1002.

The first BIRA algorithms continue to march through the memory array 1032. The BIRA algorithm examines defects in the fifth word line 1062 contained in the memory array 1032. The BIRA algorithm detects a single fault occurring in the fifth word line 1062 contained in the lower bank 1018. The tenth faulty memory cell 1056 is located at column address 6, row address 4. The BIRA algorithm does not have any redundant columns left to replace this single fault with a redundant column, therefore according to the second logical, the BIRA algorithm uses an available redundant row to replace this defective component.

Thus, the BIRA engine assigns the second redundant row to globally replace the fifth word line 1062 in the lower bank 1018 and the fifth word line 1062 in the upper bank 1020. The BIRA registers reflect this change. The BIRA engine changes the contents in row register Row2 1010 to reflect row address number 4 and stores the faulty row address in its contents. The BIRA engine changes the contents in status bit register En2 1014 to a logical 1 to indicate that the second redundant row is not longer available to substitute for the defective component. However, since a single fault was detected, then the state of decision for this redundant row is only tentatively set. The BIRA algorithm then proceeds to examine the memory addresses in the upper bank 1020 and detects multiple faults, an eleventh faulty memory cell 1058 existing in column address 2 and a twelfth faulty memory cell 1060 existing in column address 0. The BIRA algorithm references the BIRA registers and detects that row register Row2 1010 assigns the second redundant row to replace row address 4 1030. Therefore, the BIRA algorithm determines that these errors are already covered by a redundant component.

The BIRA algorithm then goes to the fourth logical step, once the highest memory address is achieved and checks to see if all the faults in this memory array 1032 were substituted by redundant components. In this example, the redundant components substitute for the defective components in order to replace every defect that occurred in this memory array 1032. Upon satisfactory completion of another quality assurance BIST with the assigned redundant components substituting for defective components, the BIRA algorithm then determines that this memory array 1032 is repaired. The reconfiguration logic reads the contents the BIRA registers to generate a repair signature such as a third repair algorithm. In an embodiment, the third repair signature may be stored in volatile memory or permanently written into the fuse box.

The sequence of operations for the algorithms may be stored in a machine-readable medium. A machine-readable medium includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.). A memory compiler may utilize a machine-readable medium that stores instructions, which when executed by a machine, causes the machine to generate any of the apparatuses or methods described above.

A memory compiler may be application-specific and are used by system IC integrators to rapidly create hundreds of silicon-proven memory cores. An embedded memory compiler may include redundancy to ensure high yield of SRAM memory blocks in system-on-chip (SOC) designs. The memory compiler allows customers to embed a number of SRAM memory blocks, such as one megabit or more, into SoC designs without sacrificing area, speed or power while improving yield.

Note, in an embodiment, some defects are unrepairable defect types and no repair signature will be generated if an unrepairable defect type is detected. In an embodiment, each set of defects detected by each test conducted are cumulative and the amount of available redundancy is set at a fixed amount.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The application specific processor may be a finite state machine. The BIRA algorithm may make one or more passes through the memory array and alter how redundant components are assigned. The invention is to be understood as not limited by the specific embodiments described herein, but only by scope of the appended claims.

I claimed:

1. A method, comprising:
   performing a first test on a memory to detect defective components in the memory;
   determining defective components in the memory from a first repair signature;
   performing a second test on the memory to detect defective components in the memory;
   allocating redundant components to repair the memory, if applicable; and generating a second repair signature that repairs defective components represented in the first repair signature as well as defective components detected during the second test.

2. The method of claim 1, further comprising if the second test does not detect any defective components, then no redundant components are allocated.

3. The method of claim 1, further comprising:
performing the second test on the memory and the generation of the second repair signature after the memory has been placed into operation.

4. The method of claim 1, further comprising:
decoding the first repair signature to determine defective components in the memory.

5. The method of claim 1, further comprising:
performing the first test of the memory and a first repair algorithm on the memory to generate the first repair signature; and
performing the second test of the memory and a second repair algorithm to generate the second repair signature, the second repair signature repairing defective components detected by the first test as well as defective components detected by the second test.

6. The method of claim 1, further comprising:
testing the memory to identify defects under a first environmental condition;
next, testing the memory to identify defects under a second environmental condition; and
generating the second repair signature to repair all of the defects detected in the first environmental condition as well as in the second environmental condition.

7. The method of claim 6, wherein the first environmental condition comprises nominal temperature, nominal operating voltage level, and nominal frequency.

8. The method of claim 6, wherein the second environmental condition comprises higher than nominal temperature, higher than nominal operating voltage level, and lower than nominal frequency.

9. The method of claim 1, further comprising:
testing the memory to identify defects with a first type of testing algorithm;
next, testing the memory to identify defects with a second type of testing algorithm; and
generating the second repair signature to repair the defects detected with the first type of testing algorithm and the second type of testing algorithm.

10. An apparatus, comprising:
one or more memories, each memory having one or more redundant components to repair one or more defects detected in the one or more memories; and
a storage device to store a first repair signature that contains data to allocate the one or more redundant components;
reconfiguration logic to receive the first repair signature, the reconfiguration logic to augment the first repair signature by generating a second repair signature.

11. The apparatus of claim 10, wherein the reconfiguration logic further comprises:
logic to determine defective components in the one or more memories from the first repair signature, the logic to initiate a test on the memory to identify defective components, and the logic to generate the second repair signature.

12. The apparatus of claim 10, wherein the logic comprises electronic circuits that follow the rules of Boolean Logic and software that contain patterns of instructions.

13. The apparatus of claim 10, further comprising:
a processor having built in self-test logic, built-in self-diagnosis logic, built in redundancy allocation logic, and the reconfiguration logic.

14. The apparatus of claim 13, wherein the processor programs one or more fuses contained in a fuse box with the second repair signature data.

15. The apparatus of claim 10, further comprising:
a volatile memory to store the second repair signature upon powering up the processor, content from the second repair signature to load into corresponding scan chain registers located in the one or more memories.

16. A memory compiler, comprising:
a machine-readable medium that stores instructions, which when executed by a machine, causes the machine to generate the apparatus of claim 10.

17. A machine-readable medium that stores instructions, which when executed by a machine, cause the machine to perform operations comprising:
determining defective components in a memory from a first repair signature;
next, performing a test on the memory to identify defective components;
allocating redundant components to repair the memory, if applicable; and
generating a second repair signature that includes defective components represented in the first repair signature.

18. The article of manufacture of claim 17, which causes the machine to perform the further operations comprising:
programming the repair information into one or more scan chain registers located in each memory without programming any non-volatile fuses.

19. The article of manufacture of claim 17, which causes the machine to perform the further operations comprising:
testing the memory to identify defects under a first environmental condition;
next, testing the memory to identify defects under a second environmental condition; and
generating the second repair signature to repair all of the defects detected in the first environmental condition as well as in the second environmental condition.

20. The article of manufacture of claim 17, which causes the machine to perform the further operations comprising:
performing a first test of the memory and a first repair algorithm on the memory to generate the first repair signature; and
performing a second test of the memory and a second repair algorithm to generate the second repair signature, the second repair signature repairing defective components detected by the first test as well as defective components detected by the second test.

21. An apparatus, comprising:
means for performing a first test on a memory to detect defective components in the memory;
means for determining defective components in the memory from a first repair signature;
means for performing a second test on the memory to detect defective components in the memory;
means for allocating redundant components to repair the memory, if applicable; and
means for generating a second repair signature that repairs defective components represented in the first repair signature as well as defective components detected during the second test.

22. The apparatus of claim 21, further comprising:

means for testing the memory to identify defects under a first environmental condition;

means for testing the memory to identify defects under a second environmental condition; and means for generating the second repair signature to repair all of the defects detected in the first environmental condition as well as in the second environmental condition.

23. The apparatus of claim 21, further comprising:

means for testing the memory to identify defects with a first type of testing algorithm;

means for testing the memory to identify defects with a second type of testing algorithm; and means for generating the second repair signature to repair all of the defects detected with either the first type of testing algorithm or with the second type of testing algorithm.

24. An apparatus, comprising:

one or more memories, each memory having one or more redundant components to repair one or more defects detected in the one or more memories; and a storage device to store a first repair signature that contains data to allocate the one or more redundant components;

logic to generate an augmented repair signature to repair all of the defects detected in a first test of a memory as well as in a second test of the memory.

* * * * *